US008422326B2

(12) United States Patent
Fujisawa et al.

(10) Patent No.: US 8,422,326 B2
(45) Date of Patent: Apr. 16, 2013

(54) SEMICONDUCTOR DEVICE HAVING SENSE AMPLIFIER

(75) Inventors: Hiroki Fujisawa, Tokyo (JP); Ryuuji Takishita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/304,040

(22) Filed: Nov. 23, 2011

(65) Prior Publication Data

US 2012/0134227 A1 May 31, 2012

(30) Foreign Application Priority Data

Nov. 25, 2010 (JP) ................................. 2010-262141

(51) Int. Cl.
*G11C 7/06* (2006.01)

(52) U.S. Cl.
USPC .......................................................... 365/208

(58) Field of Classification Search ........................ None
See application file for complete search history.

(56) References Cited

U.S. PATENT DOCUMENTS

| 6,721,213 B2 | 4/2004 | Nakayama et al. |
| 6,804,163 B2 | 10/2004 | Lee et al. |
| 6,990,028 B2 | 1/2006 | Haga et al. |
| 7,099,217 B2 | 8/2006 | Haga et al. |
| 2003/0042955 A1 | 3/2003 | Nakayama et al. |
| 2003/0174571 A1 | 9/2003 | Lee et al. |
| 2004/0233753 A1 | 11/2004 | Haga et al. |
| 2005/0035428 A1* | 2/2005 | Takaura et al. ............... 257/510 |
| 2005/0281107 A1 | 12/2005 | Haga et al. |

FOREIGN PATENT DOCUMENTS

| JP | 02-246089 A | 10/1990 |
| JP | 04-228171 A | 8/1992 |
| JP | 2003-078405 A | 3/2003 |
| JP | 2004-031908 A | 1/2004 |
| JP | 2004-348896 A | 12/2004 |

* cited by examiner

*Primary Examiner* — Hoai V Ho
*Assistant Examiner* — James G Norman
(74) *Attorney, Agent, or Firm* — McGinn IP Law Group, PLLC

(57) ABSTRACT

For example, four driver transistors are arranged in wells so as to adjoin both sides of each of two element isolation regions. Two pairs of cross-coupled sense transistors are arranged in the wells at positions farther from the element isolation regions than the driver transistors are. Such an arrangement provides more than a certain distance between the sense transistors and the respective corresponding element isolation regions. This reduces the effect of a phenomenon that threshold of a transistor varies according to a distance from an element isolation region. As a result, it is possible to exactly match the characteristics of each pair of cross-coupled transistors.

20 Claims, 15 Drawing Sheets

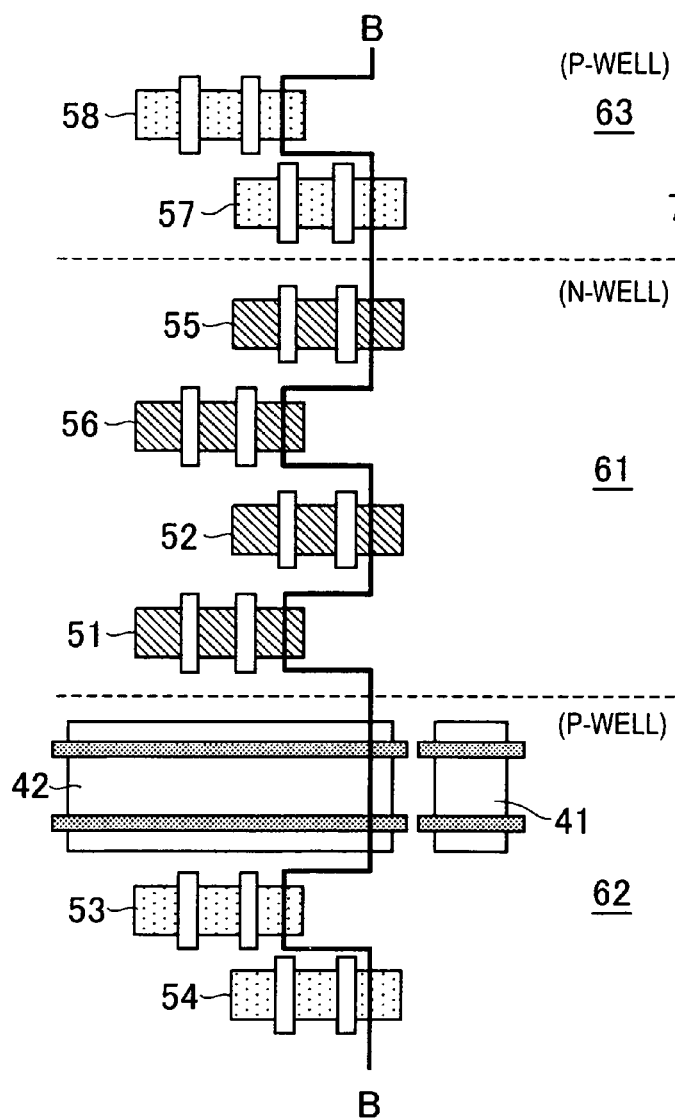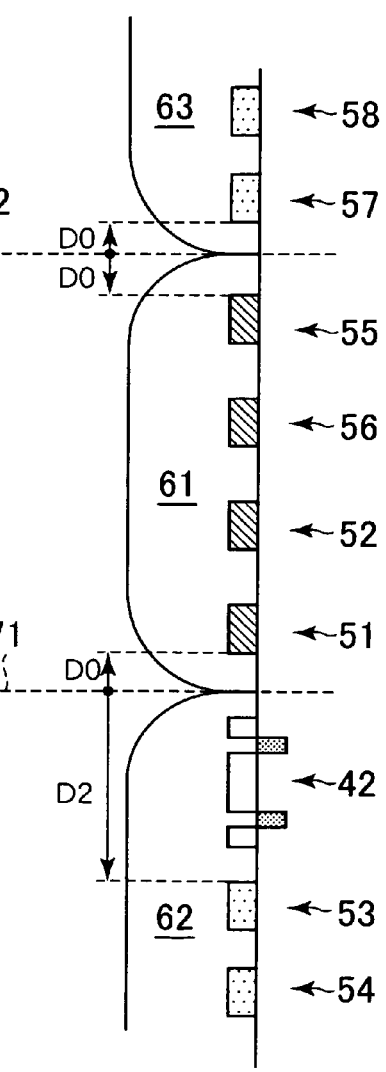

SEMICONDUCTOR DEVICE HAVING SENSE AMPLIFIER

BACKGROUND OF THE INVENTION

1. Field of the Invention

The present invention relates to a semiconductor device, and more particularly to a semiconductor device that includes a sense amplifier for amplifying a potential difference occurring between a pair of complementary bit lines.

2. Description of Related Art

Semiconductor memory devices such as a dynamic random access memory (DRAM) use sense amplifiers to amplify weak signals read from memory cells. A sense amplifier typically includes a pair of cross-coupled P-channel MOS transistors and a pair of cross-coupled N-channel MOS transistors. The P-channel MOS transistors drive either one of a pair of bit lines to a high level. The N-channel MOS transistors drive the other of the pair of bit lines to a low level (see Japanese Patent Application Laid-Open No. 2004-31908 (Patent Document 1), Japanese Patent Application Laid-Open No. 2004-348896 (Patent Document 2), Japanese Patent Application Laid-Open No. 04-228171 (Patent Document 3), Japanese Patent Application Laid-Open No. 2003-78405 (Patent Document 4), and Japanese Patent Application Laid-Open No. 02-246089 (Patent Document 5)).

In order for sense amplifiers to perform a sensing operation at high speed and with high sensitivity, each pair of cross-coupled transistors (first and second transistors) needs to have exactly matched characteristics. It is also preferred that the P-channel MOS transistors and the N-channel MOS transistors be exactly matched in operation timing.

Patent Documents 1 to 3 describe the layout of transistors that constitute a sense amplifier. The layouts discussed in Patent Documents 1 to 3, however, have had the problem of a reduced sensing margin because a pair of so-called cross-coupled transistors sometimes have a difference in characteristic. For example, two transistors in a pair have different distances from a well edge.

Patent Documents 4 and 5 describe a drive circuit for driving a sense amplifier. The drive circuit discussed in Patent Document 4 simply supplies the high side potential of a bit line to the power supply nodes of a pair of P-channel MOS transistors and the low side potential of a bit line to the power supply nodes of a pair of N-channel MOS transistors. Such a drive circuit has the problem of a slow sensing operation. On the other hand, the drive circuit discussed in Patent Document 5 supplies a potential higher than the high side potential of a bit line to the power supply nodes of a pair of P-channel MOS transistors before supplying the high side potential of a bit line. This can accelerate the sensing speed in the initial stage of the sensing operation.

For the drive circuit discussed in Patent Document 5, however, it is difficult to match the timing of a first control signal PIP which drives the power supply nodes of the pair of P-channel MOS transistors with the timing of a second control signal PIN which drives the power supply nodes of the pair of N-channel MOS transistors. There has thus been the problem of causing a skew in the operation timing. The reason is that the first control signal PIP and the second control signal PIN have different voltages.

SUMMARY

In one embodiment, there is provided a semiconductor device that includes: a first well having a first conductivity type; a second well having the first conductivity type; a third well having a second conductivity type located between the first and second wells; a first element isolation region defining a border between the first and third wells; a second element isolation region defining a border between the second the third wells; a first driver transistor of the second conductivity type formed adjacent to the first element isolation region on the first well; a second driver transistor of the first conductivity type formed adjacent to the first element isolation region on the third well; first and second sense transistors of the second conductivity type formed on the first well, the first and second sense transistors being arranged farther than the first driver transistor with respect to the first element isolation region, the first and second sense transistors being cross-coupled to each other; third and fourth sense transistors of the first conductivity type formed on the third well, the third and fourth sense transistors being arranged farther than the second driver transistor with respect to the first element isolation region, the third and fourth sense transistors being cross-coupled to each other; a third driver transistor of the second conductivity type formed adjacent to the second element isolation region on the second well; a fourth driver transistor of the first conductivity type formed adjacent to the second element isolation region on the third well; fifth and sixth sense transistors of the second conductivity type formed on the second well, the fifth and sixth sense transistors being arranged farther than the third driver transistor with respect to the second element isolation region, the fifth and sixth sense transistors being cross-coupled to each other; and seventh and eighth sense transistors of the first conductivity type formed on the third well, the seventh and eighth sense transistors being arranged farther than the fourth driver transistor with respect to the second element isolation region, the seventh and eighth sense transistors being cross-coupled to each other, wherein the first to fourth sense transistors constitute a first sense amplifier powered by the first and second driver transistors, and the fifth to eighth sense transistors constitute a second sense amplifier powered by the third and fourth driver transistors.

In another embodiment, there is provided a semiconductor device that includes: a first sense amplifier including first to fourth transistors; a second sense amplifier including fifth to eighth transistors; a ninth transistor supplying an operating voltage to the first and second transistors; a tenth transistor supplying an operating voltage to the third and fourth transistors; an eleventh transistor supplying an operating voltage to the fifth and sixth transistors; a twelfth transistor supplying an operating voltage to the seventh and eighth transistors; a first well in which the first, second, and ninth transistors are formed; a second well in which the third to sixth, tenth, and eleventh transistors are formed; and a third well in which the seventh, eighth, and twelfth transistors are formed, wherein the second well is located between the first and third wells, the first to third wells are arranged in a first direction, the first to eighth transistors are arranged in the first direction, the ninth transistor is located between the first or second transistor and a border of the first and second wells in the first direction, the tenth transistor is located between the third or fourth transistor and the border of the first and second wells in the first direction, the eleventh transistor is located between the fifth or sixth transistor and a border of the second and third wells in the first direction, and the twelfth transistor is located between the seventh or eighth transistor and the border of the second and third wells in the first direction.

In still another embodiment, there is provided a semiconductor device that includes: first and second sense transistors of a first conductivity type that have respective power supply nodes connected in common to a first sense amplifier drive line, the first and second sense transistors being cross-coupled to each other so as to drive one of a pair of bit lines to a potential of the first sense amplifier drive line based on a potential difference between the pair of bit lines; third and fourth sense transistors of a second conductivity type that have respective power supply nodes connected in common to a second sense amplifier drive line, the third and fourth sense transistors being cross-coupled to each other so as to drive the other of the pair of bit lines to a potential of the second sense amplifier drive line based on the potential difference between the pair of bit lines; a first driver transistor connected between a first power supply line and the first sense amplifier drive line, the first power supply line being supplied with a first potential; a second driver transistor connected between a second power supply line and the second sense amplifier drive line, the second power supply line being supplied with a second potential; and a third driver transistor connected between a third power supply line and the first sense amplifier drive line, the third power supply line being supplied with a third potential, wherein a potential difference between the first potential and the second potential is greater than a potential difference between the third potential and the second potential, the first and second driver transistors turn ON and the third driver transistor turns OFF during a first period, the second and third driver transistors turn ON and the first driver transistor turns OFF during a second period subsequent to the first period, the first driver transistor has a control node supplied with a first sense amplifier drive signal, the second driver transistor has a control node supplied with a second sense amplifier drive signal, and the first and second sense amplifier drive signals have the same voltage amplitude.

In still another embodiment, there is provided a semiconductor device that includes: first to fourth transistors each having a gate electrode, a drain electrode and a source electrode, the gate electrode of the first transistor being connected to the drain electrode of the second transistor, the gate electrode of the second transistor being connected to the drain electrode of the first transistor, the gate electrode of the third transistor being connected to the drain electrode of the fourth transistor, and the gate electrode of the fourth transistor being connected to the drain electrode of the third transistor; a fifth transistor connected between the source electrodes of the first and second transistors and a first line supplied with a first potential; a sixth transistor connected between the source electrodes of the third and fourth transistors and a second line supplied with a second potential; a first driver that supplies a first control signal to a gate electrode of the fifth transistor, the first control signal having the first potential of a high-side and the second potential of a low-side; and a second driver that supplies a second control signal to a gate electrode of the sixth transistor, the second control signal having the first potential of a high-side and the second potential of a low-side.

A data processing system according to the present invention includes the foregoing semiconductor device.

BRIEF DESCRIPTION OF THE DRAWINGS

FIG. 4A is a schematic plan view, and FIG. 4B is a schematic sectional view taken along a line A-A;

FIG. 5A is a schematic plan view, and FIG. 5B is a schematic sectional view taken along the line A-A;

FIGS. 7A and 7B are diagrams for explaining a layout of sense amplifiers SA according to a first prototype device;

DETAILED DESCRIPTION OF THE EMBODIMENT

Figure 1:
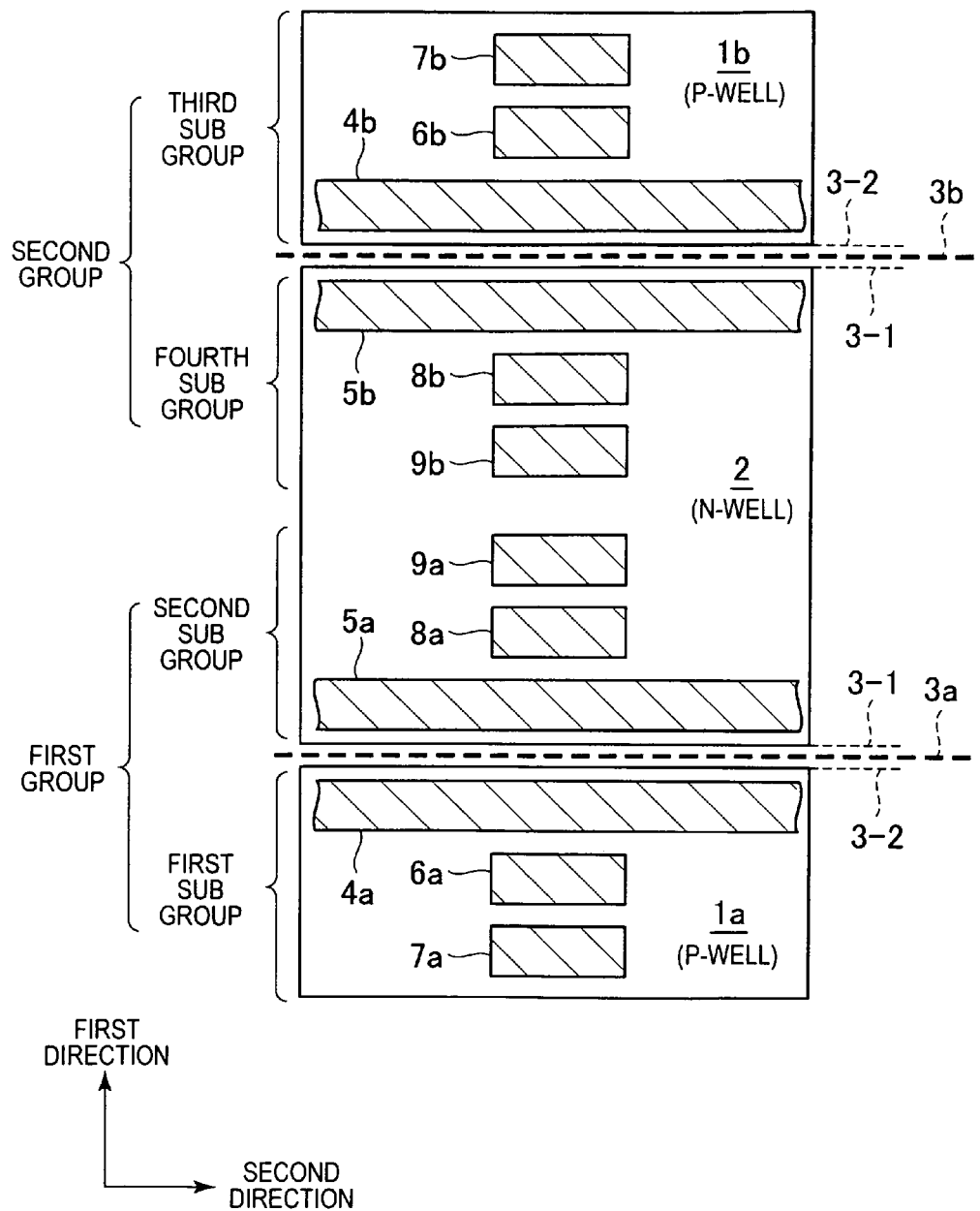
FIG. 1 is a schematic layout diagram for explaining an embodiment of the present invention.

Referring now to FIG. 1, the semiconductor device according to an embodiment of the disclosure includes first P-well 1a, second P-well 1b and an N-well 2 which are arranged in series in this order in a first direction, and two borders that separate the wells. Each of the two borders has a predetermined width in the first direction between the respective edges 3-1 of the N-well 2 and the edges 3-2 of the P-wells 1a and 1b. The two borders will be referred to as first and second element isolation regions 3a and 3b. An N-channel driver transistor 4a is arranged in the first P-well 1a so as to adjoin the first element isolation region 3a. A P-channel driver transistor 5a is arranged in the lower part of the N-well 2 so as to adjoin the first element isolation region 3a. The first P-well 1a also includes N-channel sense transistors 6a and 7a which are arranged in the first direction at positions farther from the first element isolation region 3a than the driver transistor 4a is. P-channel sense transistors 8a and 9a are arranged in the first direction in the lower part of the N-well 2, at positions farther from the element isolation region 3a than the driver transistor 5a is. An N-channel driver transistor 4b is arranged in the second P-well 1b so as to adjoin the second element isolation region 3b. A P-channel driver transistor 5b is arranged in the upper part of the N-well 2 so as to adjoin the second element isolation region 3b. The second P-well 1b also includes N-channel sense transistors 6b and 7b which are arranged in the first direction at positions farther from the second element isolation region 3b than the driver transistor 4b is. P-channel sense transistors 8b and 9b are arranged in the first direction in the upper part of the N-well 2, at positions farther from the second element isolation region 3b than the driver transistor 5b is. In FIG. 1, the areas of the plurality of driver transistors 4a, 5a, 4b, and 5b, and the plurality of sense transistors 6a to 9a and 6b to 9b represent diffusion layers corresponding to drain and source electrodes. Gate layers corresponding to gate electrodes are omitted.

The driver transistor 4a supplies a low-level potential VSS to source electrodes (power supply nodes) of the sense transistors 6a and 7a. In terms of circuits, the sense transistors 6a and 7a are configured so that their gate electrodes are cross-coupled to each other's drain electrodes. The sense transistors 6a and 7a drive either one of a not-shown pair of bit lines to VSS based on a potential difference occurring between the pair of bit lines. The driver transistor 5a supplies a high-level potential VDD to source electrodes (power supply nodes) of the sense transistors 8a and 9a. In terms of circuits, the sense transistors 8a and 9a are configured so that their gate electrodes are cross-coupled to each other's drain electrodes. The sense transistors 8a and 9a drive the other of the not-shown pair of bit lines to VDD based on the potential difference occurring between the pair of bit lines. The driver transistor 4a and the sense transistors 6a and 7a constitute a first sub group. The driver transistor 5a and the sense transistors 8a and 9a constitute a second sub group. The first and second sub groups constitute a first group as a sense amplifier for sensing a pair of bit lines and its driver. The driver transistor 4b and the sense transistors 6b and 7b constitute a third sub group. The driver transistor 5b and the sense transistors 8b and 9b constitute a fourth sub group. The third and fourth sub groups constitute a second group as a sense amplifier for sensing a pair of bit lines and its driver.

As shown in FIG. 1, the distances from the first element isolation region 3a to the sense transistors 6a and 7a are different from each other. Similarly, the distances from the first element isolation region 3a to the sense transistors 8a and 9a are different from each other. The threshold voltages of the transistors change with the distances from the element isolation region (to be more precise, from the edges of the respective corresponding wells). The closer the distance to the element isolation region is, the more significant the amount of change is. The reason is that the well edges differ from the well center in concentration. According to the layout shown in FIG. 1, the driver transistors 4a and 5a are arranged to adjoin the first element isolation region 3a. Such a layout provides accordingly large distances between the first element isolation region 3a and the sense transistors 6a to 9a. The change (the amount of change) in threshold, which depends on the distance from the first element isolation region, is therefore sufficiently small in the areas where the sense transistors 6a to 9a are arranged. This enables precise matching of characteristics between each pair of cross-coupled sense transistors 6a and 7a, and 8a and 9a. It should be noted that the driver transistors 4a and 5a both are subject to a large change (a large amount of change) in threshold. However, the thresholds of the driver transistors 4a and 5a need not be as accurate as the two thresholds of two transistors that are intended for sensing. The reason is that the driver transistors 4a and 5a each supply power to two corresponding sense transistors, and the two sense transistors have the same sensitivity.

Figure 2:
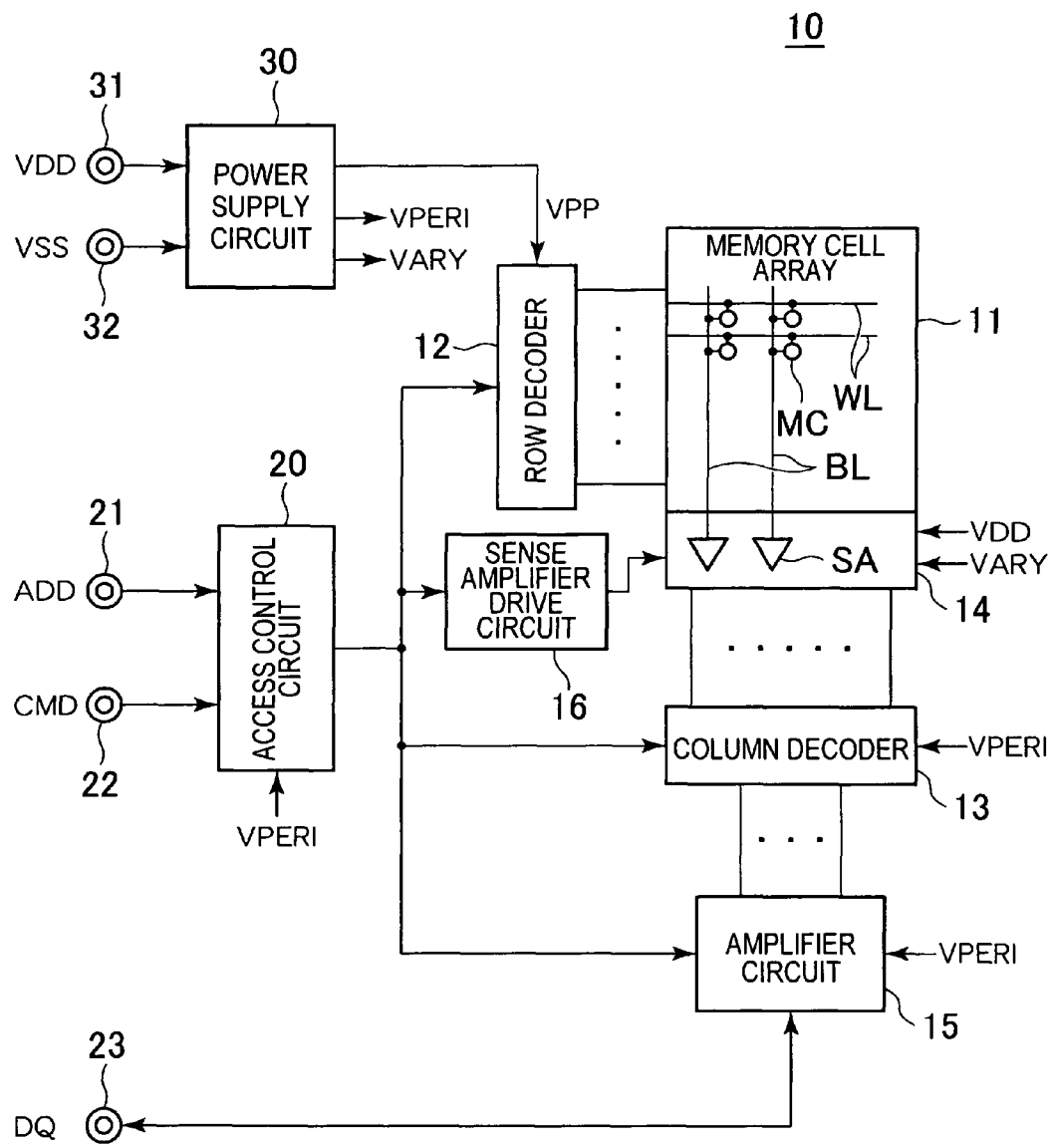
FIG. 2 is a block diagram indicative of the overall configuration of a semiconductor device 10 according to an embodiment of the present invention.

Turning to FIG. 2, the semiconductor device 10 according to the present embodiment is a DRAM, which includes a memory cell array 11. The memory cell array 11 includes a plurality of word lines WL and a plurality of bit lines BL which intersect each other. Memory cells MC are arranged at the intersections. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA. The operation of the sense circuit 14 is controlled by a sense amplifier drive circuit 16.

The operations of the row decoder 12, the column decoder 13, the amplifier circuit 15, and the sense amplifier drive circuit 16 are controlled by an access control circuit 20. An address signal ADD and a command signal CMD are supplied to the access control circuit 20 from outside through an address terminal 21 and a command terminal 22. The access control circuit 20 receives the address signal ADD and the command signal CMD, and controls the row decoder 12, the column decoder 13, the amplifier circuit 15, and the sense amplifier drive circuit 16 based on the address signal ADD and the command signal CMD.

Specifically, when the command signal CMD specifies an active operation, the address signal ADD is supplied to the row decoder 12. In response to this, the row decoder 12 selects the word line WL that is specified by the address signal ADD, whereby corresponding memory cells MC are connected to the respective bit lines BL. The access control circuit 20 then generates a sense amplifier active signal SAEB at predetermined timing, and generates original signals S1 to S3 from the sense amplifier active signal SAEB. The original signals S1 to S3 activate the sense amplifier drive circuit 16 to activate the sense amplifiers SA. The access control circuit 20 includes a circuit that generates the original signals S1 to S3. Detailed description will be given later.

Now, when the command signal CMD specifies a read operation or write operation, the address signal ADD is supplied to the column decoder 13. In response to this, the column decoder 13 connects the bit lines BL specified by the address signal ADD to the amplifier circuit 15. In a read operation, read data DQ read from the memory cell array 11 through the sense amplifiers SA is output from a data terminal 23 to outside through the amplifier circuit 15. In a write operation, write data DQ supplied from outside through the data terminal 23 is written to memory cells MC through the amplifier circuit 15 and sense amplifiers SA.

Each of the foregoing circuit blocks uses a predetermined internal voltage as its operating power supply. Such internal power supplies are generated by a power supply circuit 30 shown in FIG. 2. The power supply circuit 30 receives an external potential VDD and a ground potential VSS that are supplied through power supply terminals 31 and 32, respectively. Based on the potentials, the power supply circuit 30 generates internal voltages VPP, VPERI, VARY, etc. As employed herein, VDD, VPP, VPERI, and VARY refer not only to the levels of the respective potentials but also to potential differences (voltages) from the ground potential VSS. For example, "VDD" refers to the potential level itself of the external potential VDD, as well as the potential difference (voltage) from the ground potential VSS. The same applies to VPP, VPERI, and VARY. In the present embodiment, there holds:

$$VPP > VDD > VPERI \approx VARY.$$

The internal potential VPP is generated by boosting the external potential VDD. The internal potentials VPERI and VARY are generated by stepping down the external potential VDD.

The internal voltage VPP is mainly used in the row decoder 12. The row decoder 12 drives a word line WL selected based on the address signal ADD to the VPP level, thereby turning ON the cell transistors included in the memory cells MC. The internal voltage VARY is used in the sense circuit 14. The sense circuit 14, when activated, drives either one of each pair of bit lines to the VARY level and the other to the VSS level, thereby amplifying read data that is read out. The sense circuit 14 is also supplied with the external voltage VDD. The internal voltage VPERI is used as the operating voltage of most of the peripheral circuits such as the access control circuit 20. Using the internal voltage VPERI lower than the external voltage VDD as the operating voltage of the peripheral circuits reduces power consumption.

Figure 3:
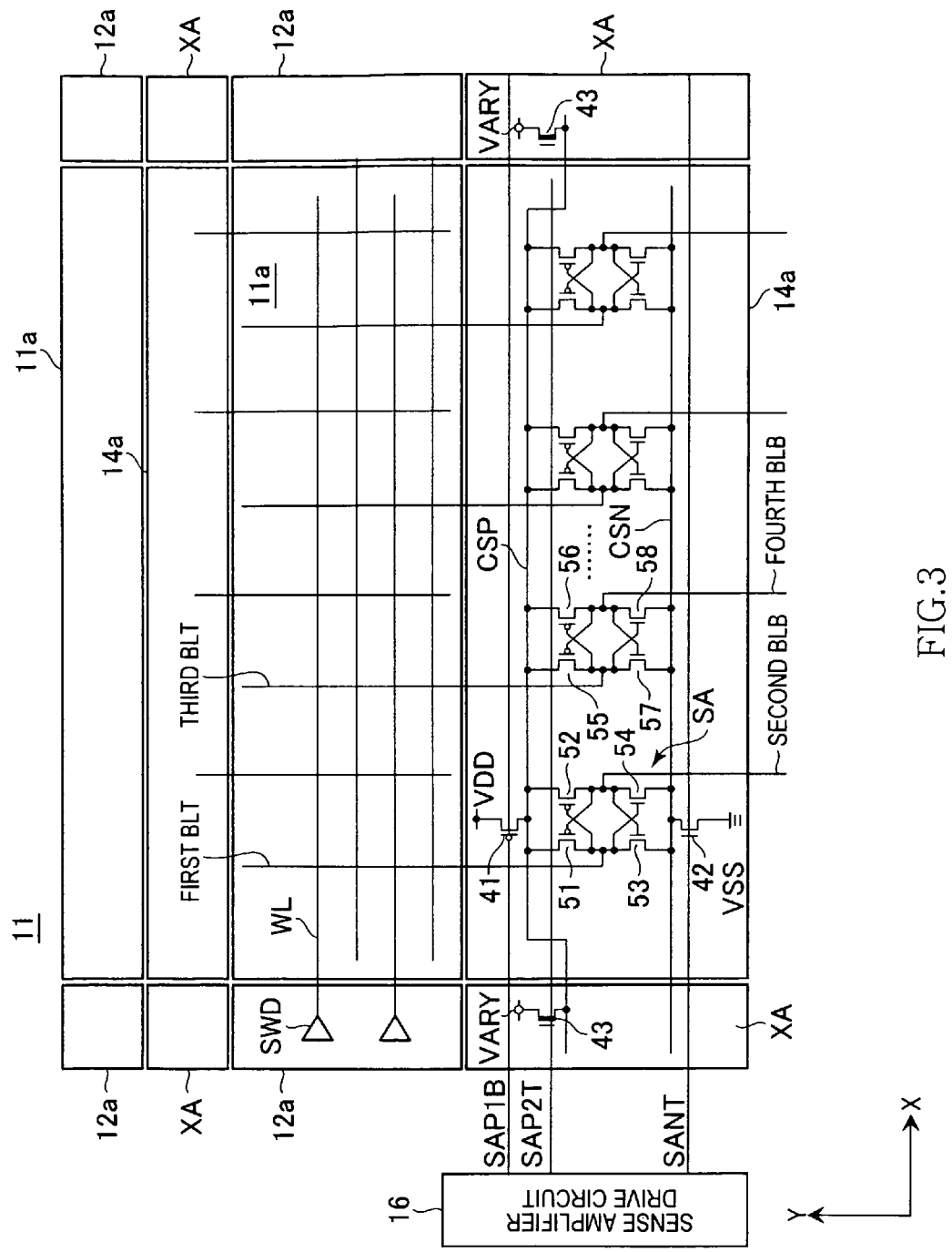
FIG. 3 is a diagram for explaining a circuit configuration and layout of a sense amplifiers SA shown in FIG. 1.

Turning to FIG. 3, the memory cell arrays 11 is divided into a plurality of memory mats 11a which are laid out in a matrix. Word driver arrays 12a are arranged on both sides of each memory mat 11a in an X direction. Sense amplifier arrays 14a are arranged on both sides of each memory mat 11a in a Y direction. The word driver arrays 12a each include a plurality of word drivers SWD which are arranged in the Y direction. The word drivers SWD drive respective corresponding word lines WL. The sense amplifier arrays 14a each include a plurality of sense amplifiers SA which are arranged in the X direction. The sense amplifiers SA are connected with respective corresponding pairs of bit lines BLT and BLB. The word driver arrays 12a and the sense amplifier arrays 14a intersect at cross areas XA, in each of which a driver transistor 43 is arranged. Memory cells are connected to the respective intersections of the word lines WL and the pairs of bit lines BLT and BLB.

Figure 4A:
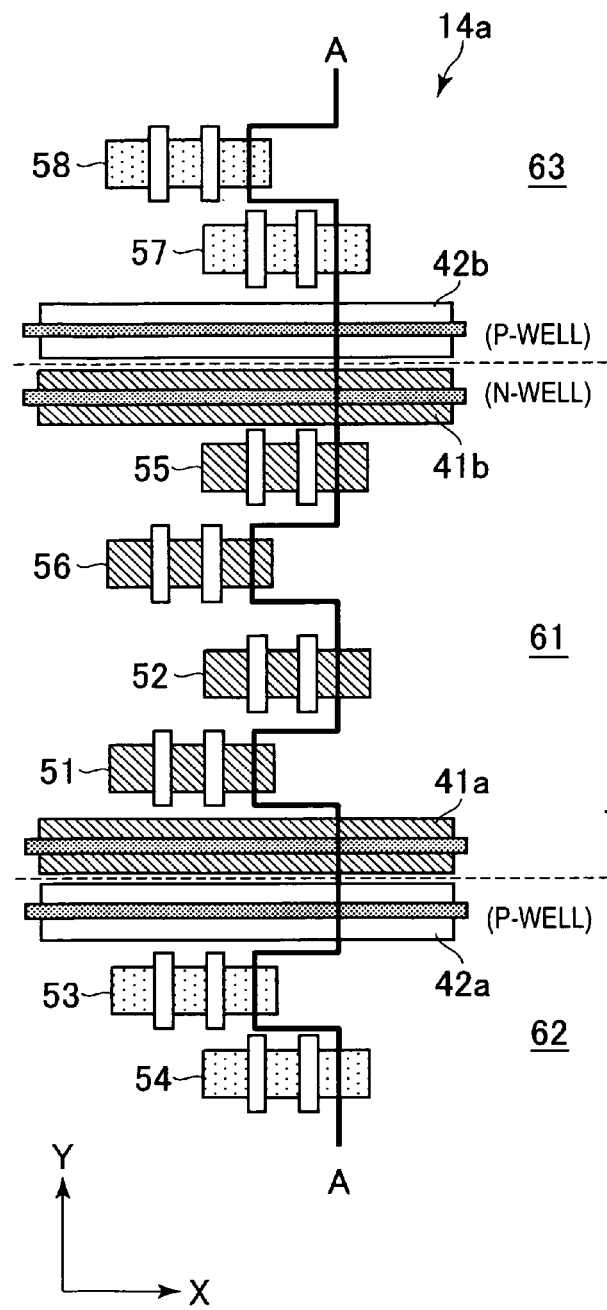
FIGS. 4A and 4B are diagrams for explaining a layout of the sense amplifiers SA on a semiconductor substrate, where
Figure 4B:
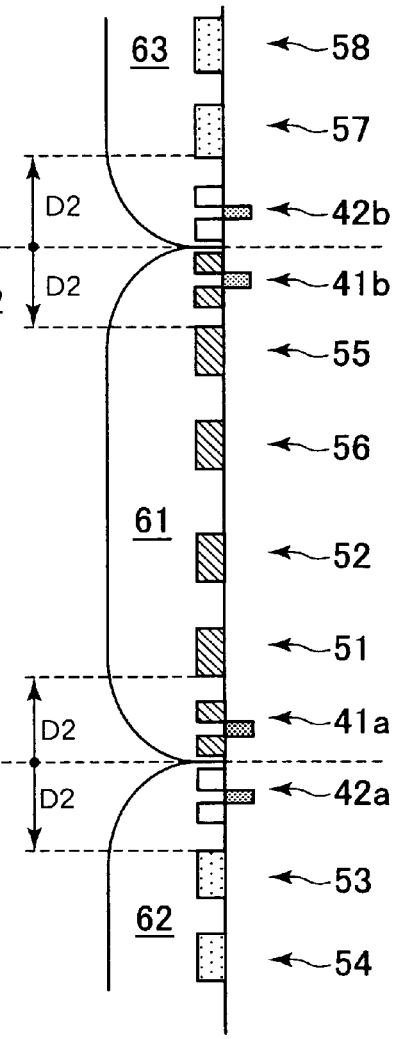

Among the plurality of sense amplifiers SA, a first sense amplifier SA includes a pair of cross-coupled P-channel MOS transistors 51 and 52 and a pair of cross-coupled N-channel MOS transistors 53 and 54. Cross-coupling means connection relationship such that the drain of either one of the transistors is connected to the gate of the other, and the drain of the other is connected to the gate of the one. Among the plurality of sense amplifiers SA, a second sense amplifier SA physically adjoining the first sense amplifier SA includes a pair of cross-coupled P-channel MOS transistors 55 and 56 and a pair of cross-coupled N-channel MOS transistors 57 and 58. In the present embodiment, such transistors that constitute sense amplifiers SA will sometimes be referred to as sense transistors. The transistors constituting the sense amplifiers SA are thin-film gate transistors which have a thin gate insulating film. The sense amplifiers SA have an open bit line structure with a bit line BLT of a corresponding first memory mat 11a and a bit line BLB of a corresponding second memory mat 11a. A plurality of sense amplifiers are developed in the X direction so that two sense amplifiers (first and second sense amplifiers SA) trace a predetermined layout, and the predetermined layout is developed in the X direction. That is, two pairs of bit lines (four bit lines) trace the predetermined layout. Detailed description will be given later (FIGS. 4A and 4B).

Sources of the sense transistors 51 and 52 are connected in common to a common source line CSP. Sources of the sense transistors 53 and 54 are connected in common to a common source line CSN. In the present embodiment, common source lines will sometimes be referred to as "sense amplifier drive lines." Drains of the sense transistors 51 and 53 are connected to a first bit line BLT. Drains of the sense transistors 52 and 54 are connected to a second bit line BLB. Sources of the sense transistors 55 and 56 are connected in common to the common source line CSP. Sources of the sense transistors 57 and 58 are connected in common to the common source line CSN. Drains of the sense transistors 55 and 57 are connected to a third bit line BLT. Drains of the sense transistors 56 and 58 are connected to a fourth bit line BLB. Consequently, when a high-level potential and a low-level potential are supplied to the common source lines CSP and CSN, respectively, a bit line having a higher potential in each of the two pairs of bit lines BLT and BLB is driven to the high-level potential. A bit line having a lower potential in each of the two pairs of bit lines BLT and BLB is driven to the low-level potential. As shown in FIG. 3, the common source lines CSP and CSN are connected to a plurality of sense amplifies SA included in a sense amplifier array 14a in common.

The common source line CSP is connected with two types of driver transistors 41 and 43. The driver transistor 41 is a thin-film gate transistor with a thin gate insulating film. The driver transistor 43 is a thick-film gate transistor with a thick gate insulating film. The driver transistor 41 is a P-channel MOS transistor connected between the common source line CSP and a power supply line to which the external potential VDD is supplied. A sense amplifier drive signal SAP1B is supplied to a gate electrode (control node) of the driver transistor 41. The sense amplifier drive signal SAP1B has an amplitude ranging from VSS to VDD, with the VSS level as the active level. When the sense amplifier drive signal SAP1B is activated to the VSS level, the common source line CSP is driven to the external potential VDD through the driver transistor 41. The driver transistor 43 is an N-channel MOS transistor connected between the common source line CSP and a power supply line to which the internal potential VARY is supplied. A sense amplifier drive signal SAP2T is supplied to a gate electrode of the driver transistor 43. The sense amplifier drive signal SAP2T has an amplitude ranging from VSS to VPP, with the VPP level as the active level. When the sense amplifier drive signal SAP2T is activated to the VPP level, the common source line CSP is driven to the internal potential VARY through the driver transistor 43. As will be described later in FIGS. 4A and 4B, the transistor 41 includes a transistor 41a and a transistor 41b. The transistor 41a corresponds to a first sense amplifier, and the transistor 41b a second sense amplifier. A transistor 42 includes a transistor 42a and a transistor 42b. The transistor 42a corresponds to a first sense amplifier, and the transistor 42b a second sense amplifier. That is, the transistors 41a and 42a correspond to a plurality of odd-numbered sense amplifiers. The transistors 41b and 42b correspond to a plurality of even-numbered sense amplifiers.

The internal potential VARY corresponds to the high-level potential to be written to memory cells MC. The low-level potential to be written to memory cells MC is VSS. When the transistor 41 turns ON, either one of a pair of bit lines BLT and BLB is then overdriven to a potential higher than the high-level potential VARY of the memory cells MC. In the present embodiment, such overdriving is performed in the initial stage of a sensing operation in order to accelerate the sensing operation.

The common source line CSN is connected with the driver transistor 42. The driver transistor 42 is a thin-film gate transistor with a thin gate insulating film. The driver transistor 42 is an N-channel MOS transistor connected between the common source line CSN and a power supply line to which the ground potential VSS is supplied. A sense amplifier drive signal SANT is supplied to a gate electrode of the driver transistor 42. The sense amplifier drive signal SANT has an amplitude ranging from VSS to VDD, with the VDD level as the active level. When the sense amplifier drive signal SANT is activated to the VDD level, the common source line CSN is driven to the ground potential VSS through the driver transistor 42. As mentioned previously, the high-level potential of the memory cells MC is VARY. The application of the signal of the VDD level (>VARY) to the gate electrode of the driver transistor 42, in fact, will not substantially improve the sensing speed. In the present embodiment, the sense amplifier drive signal SANT is deliberately given the amplitude of VSS to VDD in order to resolve skew. Detailed description will be given later.

Turning to FIGS. 4A and 4B, a sense amplifier array 14a includes an N-well 61 which extends in the X direction. P-wells 62 and 63 extending in the X direction are arranged on both sides of the N-well 61 in the Y direction. In other words, the N-well 61 is sandwiched between the two P-wells 62 and 63 in the Y direction. The P-wells 62 and 63 may be shared with adjoining memory mats 11a.

There is an element isolation region 71 between the N-well 61 and the P-well 62. Similarly, there is an element isolation region 72 between the N-well 61 and the P-well 63. Both the element isolation regions 71 and 72 extend in the X direction.

The P-well 62 includes an N-channel MOS transistor 42a which adjoins the element isolation region 71 and extends along the element isolation region 71. It will be understood that the diffusion layer of the N-channel MOS transistor 42a is at a predetermined distance from the edge of the P-well 62, the edge being included in the element isolation region 71. The transistor 42a is one of the transistors that constitute the driver transistor 42 shown in FIG. 3. Similarly, the P-well 63 includes an N-channel MOS transistor 42b which adjoins the element isolation region 72 and extends along the element isolation region 72. It will be understood that the diffusion layer of the N-channel MOS transistor 42b is at a predetermined distance from the edge of the P-well 63, the edge being included in the element isolation region 72. Again, the transistor 42b is one of the transistors that constitute the driver transistor 42 shown in FIG. 3. The sense amplifier drive signal SANT (FIG. 3) is supplied to gate electrodes of the transistors 42a and 42b in common.

The N-well 61 includes a P-channel MOS transistor 41a which adjoins the element isolation region 71 and extends along the element isolation region 71. It will be understood that the diffusion layer of the P-channel MOS transistor 41a is at a predetermined distance from an edge of the N-well 61, the edge being included in the element isolation region 71. The transistor 41a is one of the transistors that constitute the driver transistor 41 shown in FIG. 3. The N-well 61 also includes a P-channel MOS transistor 41b which adjoins the element isolation region 72 and extends along the element isolation region 72. It will be understood that the diffusion layer of the P-channel MOS transistor 41b is at a predetermined distance from an edge of the N-well 61, the edge being included in the element isolation region 72. Again, the transistor 41b is one of the transistors that constitute the driver transistor 41 shown in FIG. 3. The sense amplifier drive signal SAP1B (FIG. 3) is supplied to gate electrodes of the transistors 41a and 41b in common.

As shown in FIGS. 4A and 4B, gate electrodes of the driver transistors 41 and 42 extend in the X direction. When the transistors are ON, a current therefore flows in the Y direction. That is, the Y direction indicates the channel lengths of the driver transistors 41 and 42. Meanwhile, the driver transistors 41 and 42 may have an arbitrary gate width (width in the X direction). In FIG. 4A, the gate width is shared with eight sense amplifiers.

The P-well 62 further includes sense transistors 53 and 54 which are arranged at positions farther from the element isolation region 71 than the driver transistor 42a is. The sense transistors 53 and 54 are at different distances from the element isolation region 71. It should be noted that the distances from the element isolation region 71 to the sense transistors 53 and 54 are greater than or equal to D2. The meaning of D2 will be described later in FIG. 6. Similarly, the P-well 63 includes sense transistors 57 and 58 which are arranged at positions farther from the element isolation region 72 than the driver transistor 42b is. The sense transistors 57 and 58 are at different distances from the element isolation region 72. The distances from the element isolation region 72 to the sense transistors 57 and 58 are greater than or equal to D2. The sense transistors 53 and 54 arranged in the P-well 62 and the sense transistors 57 and 58 arranged in the P-well 63 constitute different sense amplifiers SA. The configuration will be easily understood from the connection of a plurality of bit lines in FIG. 5A to be seen later.

The N-well 61 includes sense transistors 51 and 52 which are arranged at positions farther from the element isolation region 71 than the driver transistor 41a is. The sense transistors 51 and 52 are at different distances from the element isolation region 71. The distances from the element isolation region 71 to the sense transistors 51 and 52 are greater than or equal to D2. The N-well 61 also includes sense transistors 55 and 56 which are arranged at positions farther from the element isolation region 72 than the driver transistor 41b is. The sense transistors 55 and 56 are at different distances from the element isolation region 72. The distances from the element isolation region 72 to the sense transistors 55 and 56 are greater than or equal to D2. The sense transistors 51 and 52 arranged closer to the element isolation region 71 and the sense transistors 55 and 56 arranged closer to the element isolation region 72 constitute different sense amplifiers SA. The configuration will be easily understood from the connection of the plurality of bit lines in FIG. 5A to be seen later.

According to such a layout, there is always the driver transistor 41 or 42 between the element isolation regions 71 and 72 and the sense transistors 51 to 54 and 55 to 58, respectively. That is, the distances from the element isolation region 71 to the sense transistors 51 to 54 and from the element isolation region 72 to the sense transistors 55 to 58 are maintained to be greater than or equal to D2 shown in FIG. 4B. The meaning of the distance D2 will be described later in FIG. 6. The plurality of transistors constituting the sense amplifiers SA and the plurality of driver transistors 41 and 42 associated with the plurality of transistors are a thin-film gate transistor each. The sense amplifier array 14a is thus prevented from increasing in area despite the presence of the distances D2.

As shown in FIGS. 4A and 4B, the gate electrodes (hollow boxes) of the sense transistors 51 to 54 extend in the Y direction. When the transistors are ON, a current therefore flows in the X direction.

Figure 5A:
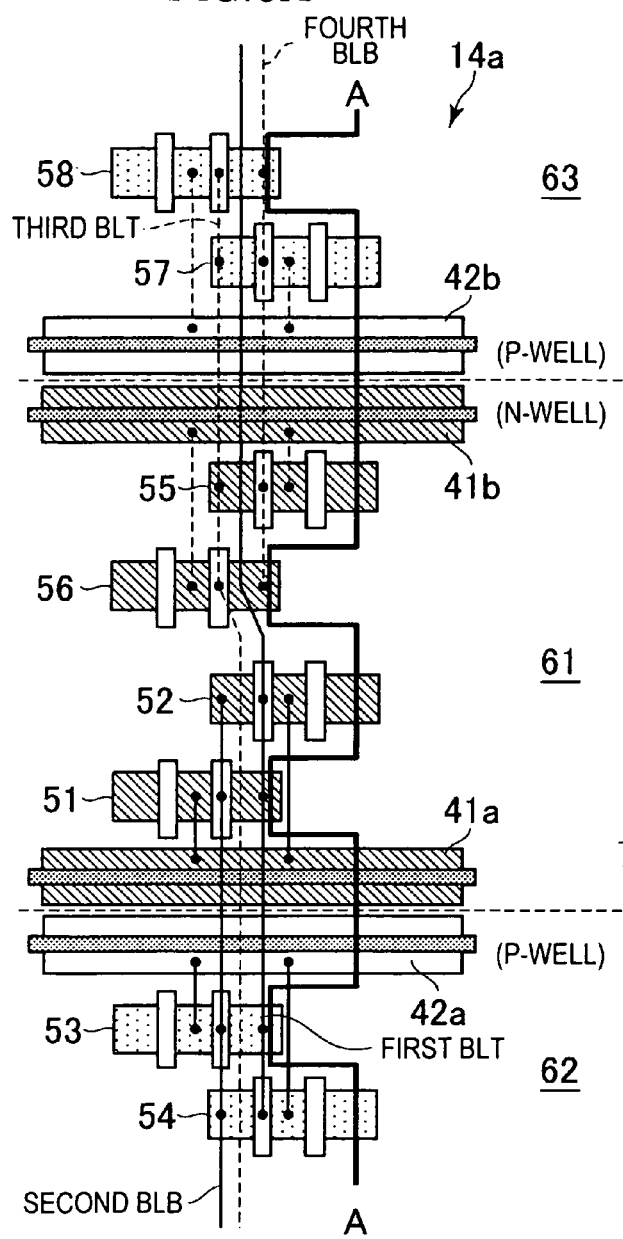
FIGS. 5A and 5B are diagrams for explaining connection relationship between transistors, where
Figure 5B:
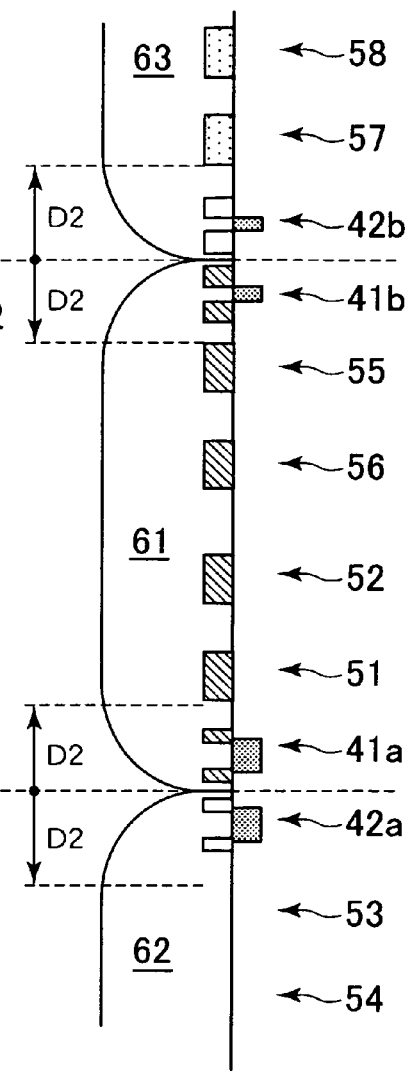

Turning to FIGS. 5A and 5B, the drains of the sense transistors 51 and 53 in the first sense amplifier SA are connected to the first bit line BLT as well as to gate electrodes of the sense transistors 52 and 54 in common. Similarly, the drains of the sense transistors 52 and 54 in the first sense amplifier SA are connected to the second bit line BLB as well as to gate electrodes of the sense transistors 51 and 53 in common. The sources of the sense transistors 51 and 52 are connected to a drain of the driver transistor 41a. The sources of the sense transistors 53 and 54 are connected to a drain of the driver transistor 42a. It should be noted that the remaining gate electrodes of the sense transistors 51 and 53 constitute gates of transistors that are associated with a not-shown sense amplifier adjoining to the left of the first sense amplifier SA. The remaining gate electrodes of the sense transistors 52 and 54 constitute gates of transistors that are associated with a not-shown sense amplifier adjoining to the right of the first sense amplifier SA. Now, the drains of the sense transistors 55 and 57 in the second sense amplifier SA are connected to the third bit line BLT as well as to gate electrodes of the sense transistors 56 and 58 in common. Similarly, the drains of the sense transistors 56 and 58 in the second sense amplifier SA are connected to the fourth bit line BLB as well as to gate electrodes of the sense transistors 55 and 57 in common. The sources of the sense transistors 55 and 56 are connected to the drain of the driver transistor 41b. The sources of the sense transistors 57 and 58 are connected to the drain of the driver transistor 42b. The remaining gate electrodes of the sense transistors 56 and 58 constitute gates of transistors that are associated with a not-shown sense amplifier adjoining to the left of the second sense amplifier SA. The remaining gate electrodes of the sense transistors 55 and 57 constitute gates of transistors that are associated with a not-shown sense amplifier adjoining to the right of the second sense amplifier SA. The circuits of the sense amplifiers SA shown in FIG. 3 are thus constructed. The output line of the driver transistor 43 arranged in the cross area XA (FIG. 3) is passed through (not shown) the area of the N-well 61 and electrically connected to the drain electrodes of the corresponding transistors 41a and 41b and the source electrodes of the transistors 51, 52, 55, and 56.

In the present embodiment, eight sense transistors are arranged side by side in the Y direction, whereby two sense amplifiers SA are constituted (excluding the remaining plurality of gate electrodes). In other words, two sense amplifiers SA are laid out in an area as much as a single pitch. In FIG. 5A, the wiring related to one of the sense amplifiers SA (first sense amplifier SA) is shown in solid lines. The wiring related to the other sense amplifier SA (second sense amplifier SA) is shown in broken lines. The lower sense amplifier SA in FIGS. 5A and 5B (first sense amplifier SA) drives the pair of bit lines BLT and BLB shown in the solid lines (first bit line BLT and second bit line BLB). The upper sense amplifier SA in FIGS. 5A and 5B (second sense amplifier SA) drives the pair of bit lines BLT and BLB shown in the broken lines (third bit line BLT and fourth bit line BLB).

Figure 6:
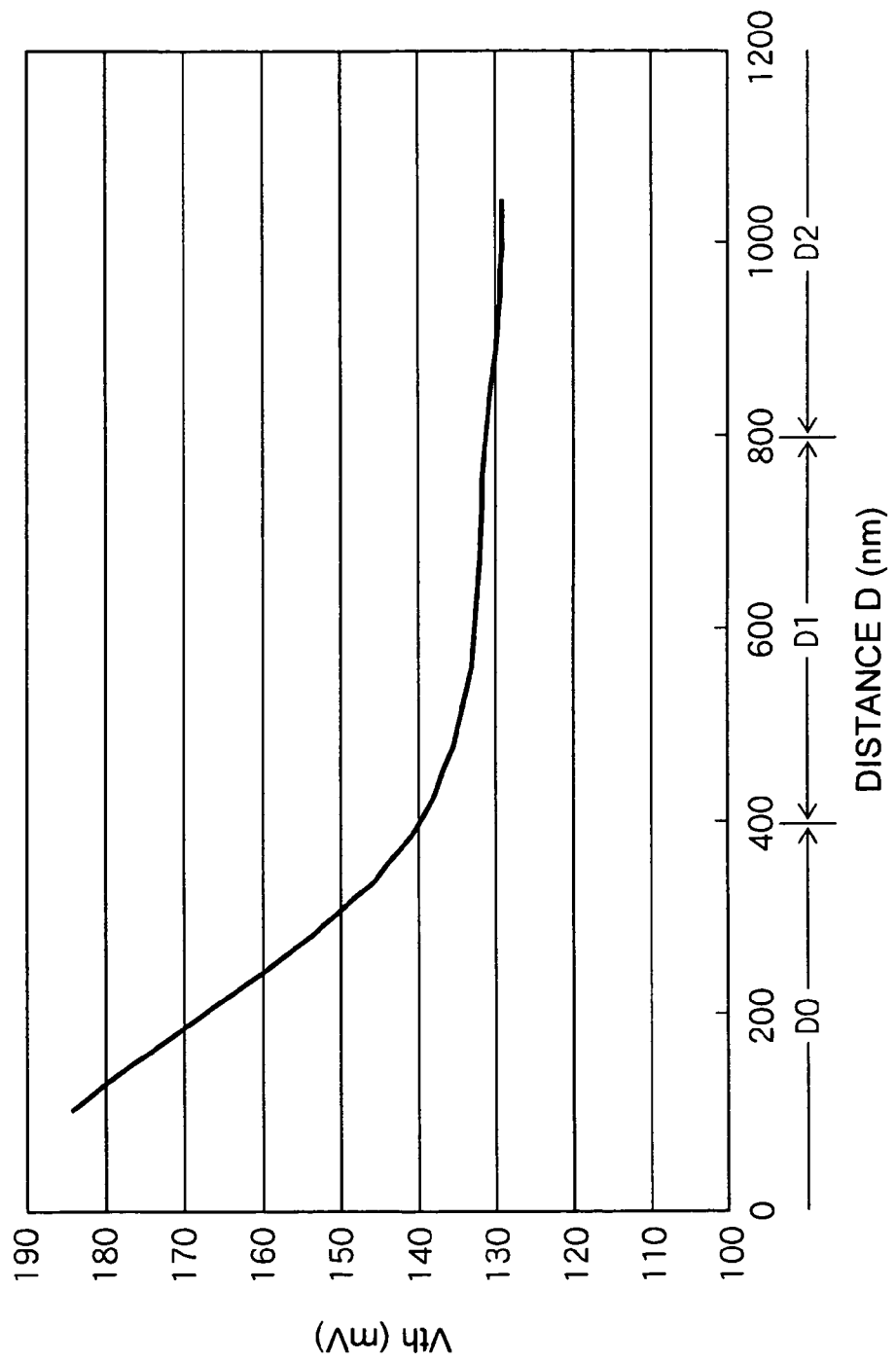
FIG. 6 is a graph indicative of the relationship between a threshold Vth of a P-channel MOS transistor formed in an N-well and the distance D from an element isolation region.

Turning to FIG. 6, the threshold Vth of the P-channel MOS transistor increases with decreasing distance from the element isolation region. The amount of change is significantly high in the area where the distance from the element isolation region is less than approximately 400 nm (D0). The amount of change does not vary much if the distance from the element isolation region reaches or exceeds approximately 400 nm (D1), and varies little if the distance from the element isolation region reaches or exceeds approximately 800 nm (D2). Such a tendency is not limited to P-channel MOS transistors but is also observed in N-channel MOS transistors. The distances for a stable threshold Vth are not always the same, however. In FIGS. 4A and 4B, all the sense transistors are at distances of D2 from the corresponding element isolation regions 71 and 72.

In a device shown in FIG. 7 that the inventor have conceived as a prototype in the course of making the present invention, both the driver transistors 41 and 42 are N-channel MOS transistors, which are arranged in only one P-well 62. A first gate electrode of the driver transistor 41 is associated with the sense transistors 51 and 52. A second gate electrode of the driver transistor 41 is associated with the sense transistors 55 and 56. A first gate electrode of the driver transistor 42 is associated with the sense transistors 53 and 54. A second gate electrode of the driver transistor 42 is associated with the sense transistors 57 and 58. Consequently, in the N-well 61, the sense transistors 51 and 55 are arranged to adjoin the element isolation regions 71 and 72, respectively. The corresponding sense transistors 52 and 56 are arranged somewhat farther from the element isolation regions 71 and 72.

In such a case, the distances from the respective element isolation regions 71 and 72 to the sense transistors 51 and 55 (D0) are different from the distances from the respective element isolation regions 71 and 72 to the sense transistors 52 and 56 (D2). Here, D2 is the same as in the layout of the embodiment shown in FIGS. 4A and 4B. Since the distances from the sense transistors 51 and 55 to the respective corresponding element isolation regions 71 and 72 have an absolute value as small as D0, the threshold varies greatly due to a difference in distance as has been described in conjunction with FIG. 6. Consequently, the pair of sense transistors 51 and 52 and the pair of sense transistor 55 and 56, which are supposed to have the same characteristics each other, cause a considerable difference in characteristic. Such a difference leads to a deteriorated sensing margin. A difference in sensing margin between the two pairs of transistors also matters.

The foregoing phenomenon also applies to the sense transistors 57 and 58 which are arranged in the P-well 63. On the other hand, the sense transistors 53 and 54 arranged in the P-well 62 are at distances as far as D2 from the element isolation region 71. The sense transistors 53 and 54 therefore have little difference in characteristic. In other words, characteristics vary even from one sense amplifier SA to another.

Figures 8A, 8B:
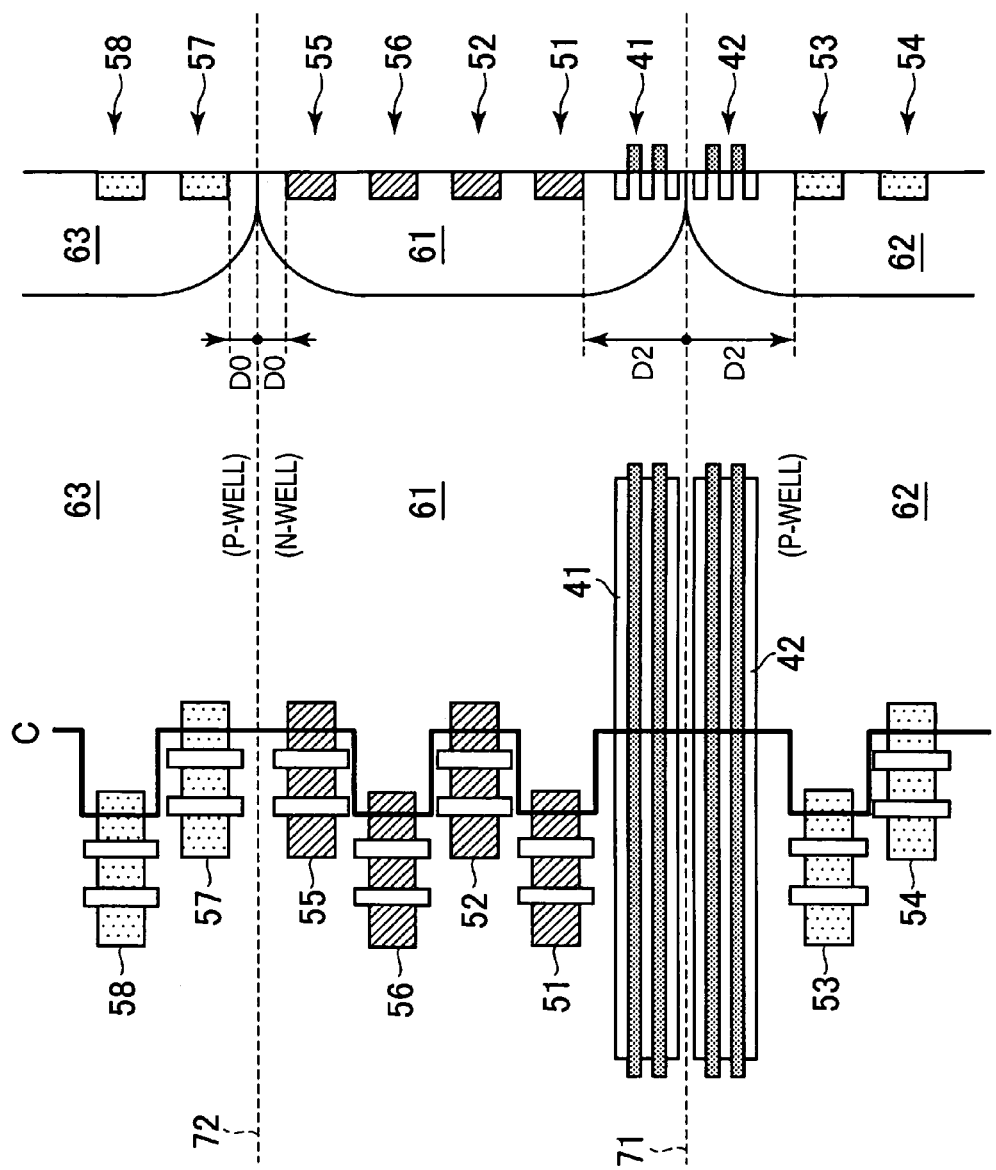
FIGS. 8A and 8B are diagrams for explaining a layout of sense amplifiers SA according to a second prototype device.

In a device shown in FIG. 8 that the inventor have conceived as a prototype in the course of making the present invention, the driver transistor 41 is a P-channel MOS transistor and the driver transistor 42 is an N-channel MOS transistor as in the present embodiment. A difference from the present embodiment consists in that both the driver transistors 41 and 42 are arranged only on the side of the element isolation region 71. A first gate electrode of the driver transistor 41 is associated with the sense transistors 51 and 52. A second gate electrode of the driver transistor 41 is associated with the sense transistors 55 and 56. A first gate electrode of the driver transistor 42 is associated with the sense transistors 53 and 54. A second gate electrode of the driver transistor 42 is associated with the sense transistors 57 and 58. In the lower one of the sense amplifiers SA in the diagrams, distances from the element isolation region 71 to the transistors 51 to 54 are greater than or equal to D2. In contrast, the transistors 55 and 57 of the transistors 55 to 58 that pertain to the other upper sense amplifier SA in the diagrams lie at distances as close as D0 to the element isolation region 72.

As a result, the upper sense amplifier SA in the diagrams has a large difference in threshold due to a difference in the distance from the element isolation region 72. The pair of sense transistors 55 and 56 and the pair of sense transistor 57 and 58, which are supposed to have the same characteristics each other, therefore cause a considerable difference in characteristic. Such a difference leads to a deteriorated sensing margin.

The foregoing phenomenon hardly occurs in the sense amplifier SA that adjoins the driver transistor 41 and 42 since the transistors 51 to 54 are at distances as large as D2 from the element isolation region 71. In other words, characteristics vary even from one sense amplifier SA to another.

In the present embodiment, unlike the prototypes, none of the sense transistors 51 to 54 adjoins the element isolation region 71 or 72. The driver transistor 41 or 42 is always interposed between the sense transistors 51 to 54 and 55 to 58 and the corresponding element isolation regions 71 and 72. This makes the distances from the element isolation regions and 72 always greater than or equal to D2. Since characteristic differences within a sense amplifier due to differences in threshold Vth become negligibly small, it is possible to improve the sensing margin. The characteristic differences within a sense amplifier include a first characteristic difference between cross-coupled P-channel MOS transistors, a second characteristic difference between cross-coupled N-channel MOS transistors, and a difference between the first and second characteristic differences. Characteristic differences between the plurality of sense amplifiers can also be suppressed.

Figure 9:
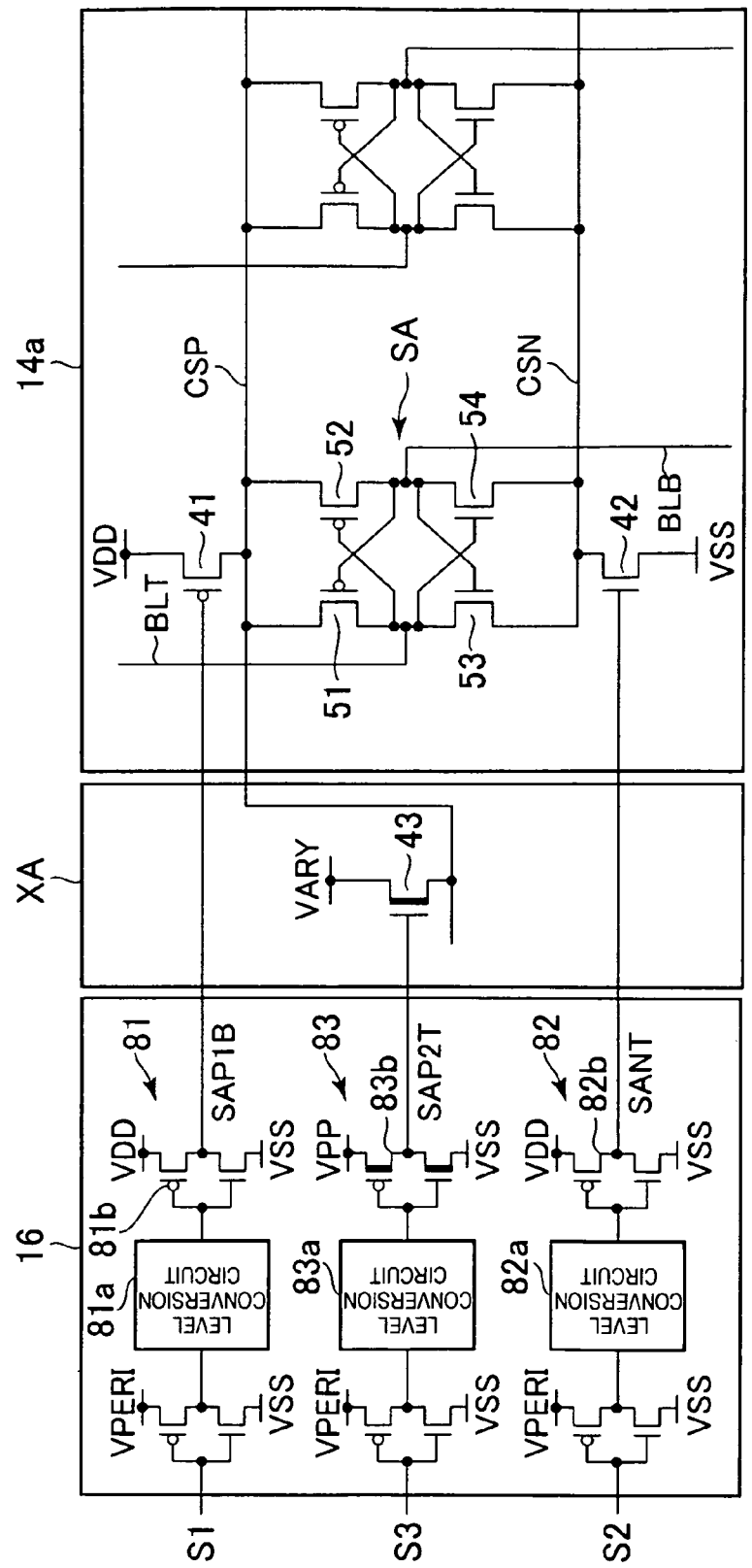
FIG. 9 is a diagram indicative of sense amplifiers SA and a part of circuits in a sense amplifier drive circuit 16 shown in FIG. 1.
Figure 10:
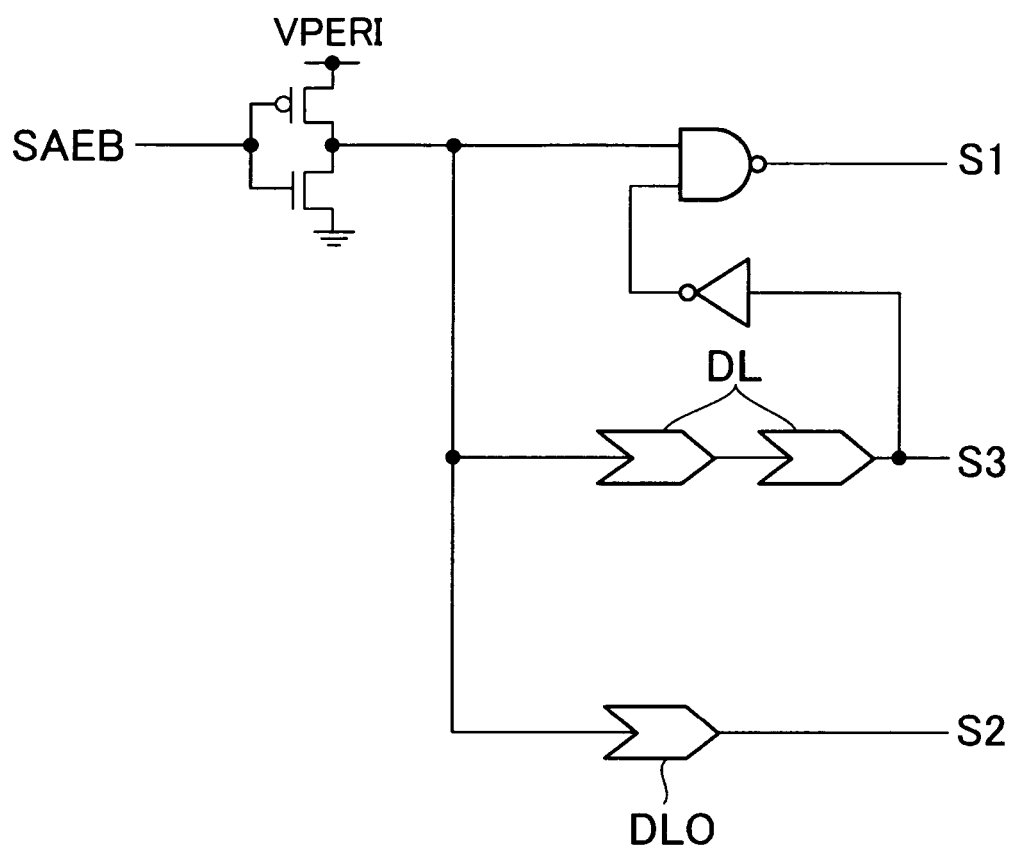
FIG. 10 is a diagram indicative of a circuit that generates original signals S1 to S3, the circuit being included in the access control circuit 20 shown in FIG. 1.

Turning to FIG. 9, the sense amplifier drive circuit 16 includes drive circuits 81 to 83 which generate the sense amplifier drive signals SAP1B, SANT, and SAP2T, respectively. The drive circuits 81 to 83 include level conversion circuits 81a to 83a that convert the voltage amplitudes of the original signals S1 to S3 which have an amplitude ranging from VSS to VPERI. The level conversion circuits 81a and 82a are circuits for converting the amplitudes of the original signals S1 and S2 ranging from VSS to VPERI into an amplitude ranging from VSS to VDD. The external potential VDD and the ground potential VSS are supplied from outside the semiconductor device through the power supply terminals 31 and 32, respectively. The level conversion circuit 83a is a circuit for converting the amplitude of the original signal S3 ranging from VSS to VPERI into an amplitude ranging from VSS to VPP. VPP is a potential higher than VPERI and VDD. VDD is a potential higher than VPERI. Turning to FIG. 10, the original signals S1 to S3 are all generated based on the sense amplifier active signal SAEB. The sense amplifier active signal SAEB and the original signals S1 to S3 are a plurality of control signals that the access control circuit 20 (FIG. 2) generates. The sense amplifier active signal SAEB changes from HIGH to LOW at active time. Specifically, the original signal S1 is generated by a NAND gate circuit that receives the inverted signal of the sense amplifier active signal SAEB and the inverted signal of the original signal S3. The original signal S3 is generated by delaying the sense amplifier active signal SAEB with a plurality of delay elements DL. The original signal S2 is generated by adjusting the timing of the sense amplifier active signal SAEB by using a skew adjusting delay element DL0. The potential VPERI is supplied to all portions of the circuit that generate the original signals S1 to S3.

The signals converted in level by the level conversion circuits 81a to 83a are output as the sense amplifier drive signals SAP1B, SANT, and SAP2T through output inverters 81b to 83b, respectively. The output inverters 81b and 82b are powered by VDD and VSS. The output inverter 83b is powered by VPP and VSS.

The sense amplifier drive signals SAP1B, SANT, and SAP2T thus generated are supplied to the gate electrodes of the driver transistors 41 to 43, respectively. The driver transistor 41 is a P-channel MOS transistor. The driver transistors 42 and 43 are an N-channel MOS transistor each. For the sake of reliability, a thick-film gate transistor having a thick gate insulating film is used for the driver transistor 43 because a high-potential level of the sense amplifier drive signal SAP2T applied to its gate electrode is VPP. The same holds for the output inverter 83b. The same also applies to some of the transistors that pertain to the output node of the level conversion circuit 83a. In FIG. 9, the transistor 43 is shown in a thick line in part, which indicates that the transistor is a thick-film gate transistor. On the other hand, the driver transistors 41 and 42 each are a thin-film gate transistor having a thin gate insulating film because a high-potential level of the sense amplifier drive signals SAP1B and SANT applied to their gate electrodes is VDD. Since thin-film gate transistors have a current driving capability higher than that of thick-film gate transistors, the common source lines CSP and CSN are quickly driven when the sense amplifier drive signals SAP1B and SANT are activated.

Figure 11:
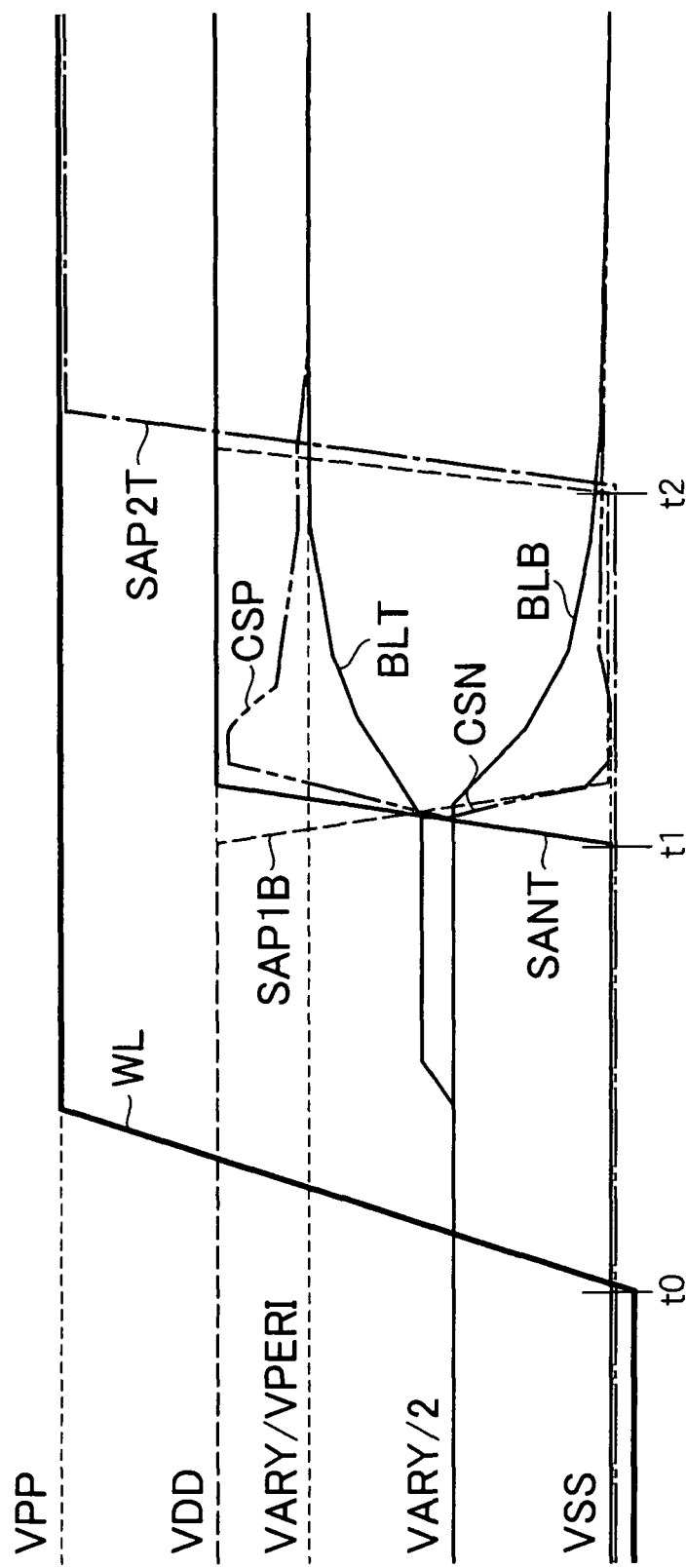
FIG. 11 is an operation waveform chart for explaining an operation of a sense amplifier SA.

Turning to FIG. 11, a predetermined word line WL is selected at time t0. The word line WL is boosted to the VPP level, which produces a potential differences between a pair of bit lines BLT and BLB in response to a charge retained in a memory cell. In the example shown in FIG. 11, the bit line BLT shows a level slightly higher than VARY/2, the intermediate level. The bit line BLB serves as a referential bit line and maintains the intermediate level VARY/2.

Subsequently, at time t1, the sense amplifier drive signals SAP1B and SANT are activated to the VSS level and the VDD level, respectively. The common source line CSP is thereby overdriven to the VDD level. The common source line CSN is driven to the VSS level. The sense amplifier drive signals SAP1B and SANT have the same amplitude, and thus the level conversion circuit 81a and the level conversion circuit 82a shown in FIG. 9 have the same amount of delay in operation. Consequently, the sense amplifier drive signals SAP1B and SANT are activated properly at the same time.

Then, at time t2, the sense amplifier drive signal SAP1B is deactivated to the VDD level and the sense amplifier drive signal SAP2T is activated to the VPP level. The common source line CSP is thereby driven to the VARY level. As a result, the bit line BLT reaches the VARY level and the bit line BLB the VSS level.

Figure 12:
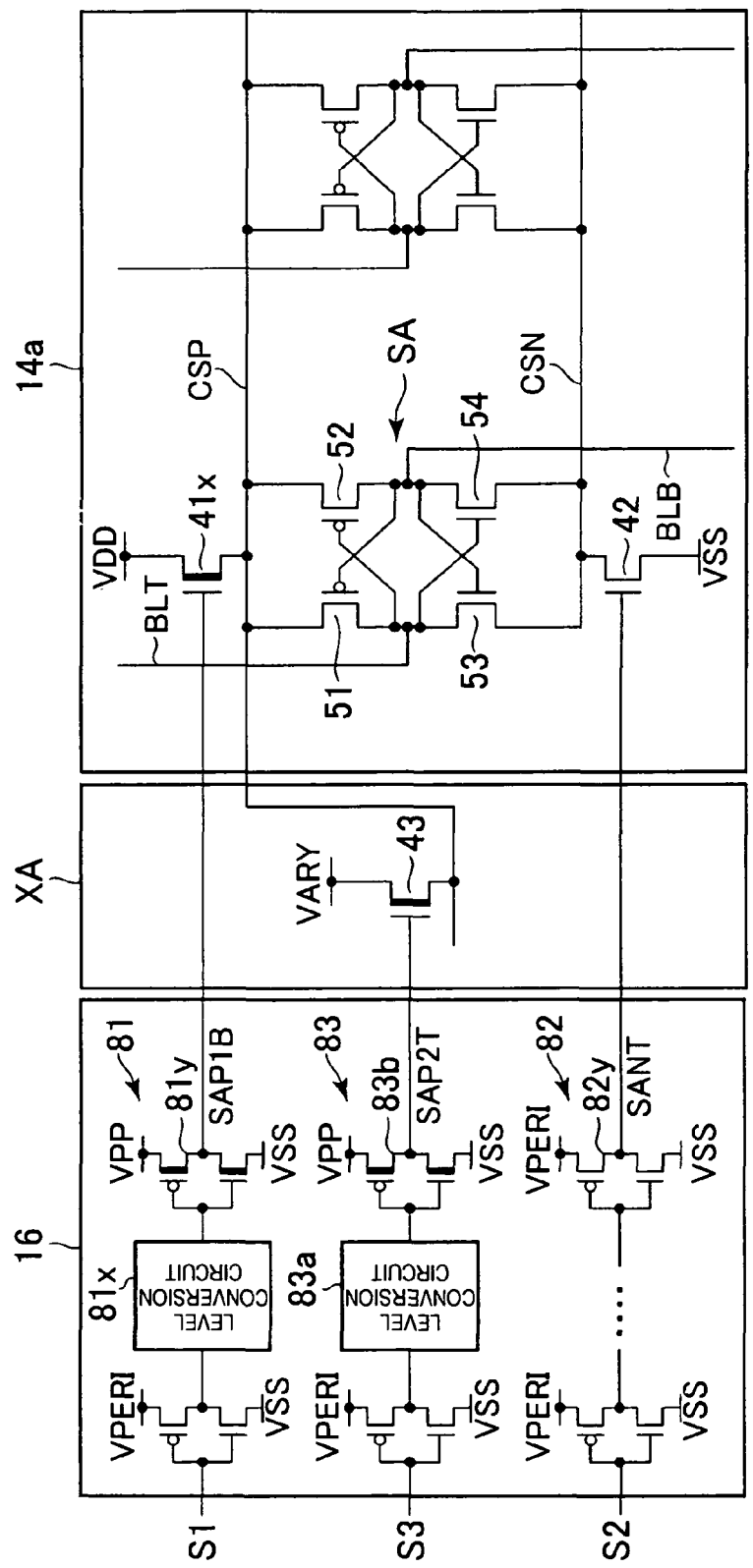
FIG. 12 is a diagram indicative of sense amplifiers SA and a part of circuits in a sense amplifier drive circuit 16 according to the first prototype device.

In a device shown in FIG. 12 that the inventor have conceived as a first prototype in the course of making the present invention, a driver transistor 41x is composed of an N-channel MOS transistor. The sense amplifier drive signal SAP1B to be applied to the gate electrode of the driver transistor 41x has an amplitude ranging from the VSS level to the VPP level. A thick-film gate transistor is thus used for the driver transistor 41x.

The sense amplifier drive circuit 16 includes a level conversion circuit 81x and an output inverter 81y. The level conversion circuit 81x converts the amplitude of the original signal ranging from VSS to VPERI into an amplitude ranging from VSS to VPP. The output inverter 81y outputs the sense amplifier drive signal SAP1B converted by the level conversion circuit 81x to the common source line CSP. On the other hand, the sense amplifier drive signal SANT maintains the amplitude VSS to VPERI of the original signal. The sense amplifier drive signal SANT is thus output to the common source line CSN by an output inverter 82y without the intervention of a level conversion circuit.

Figure 13:
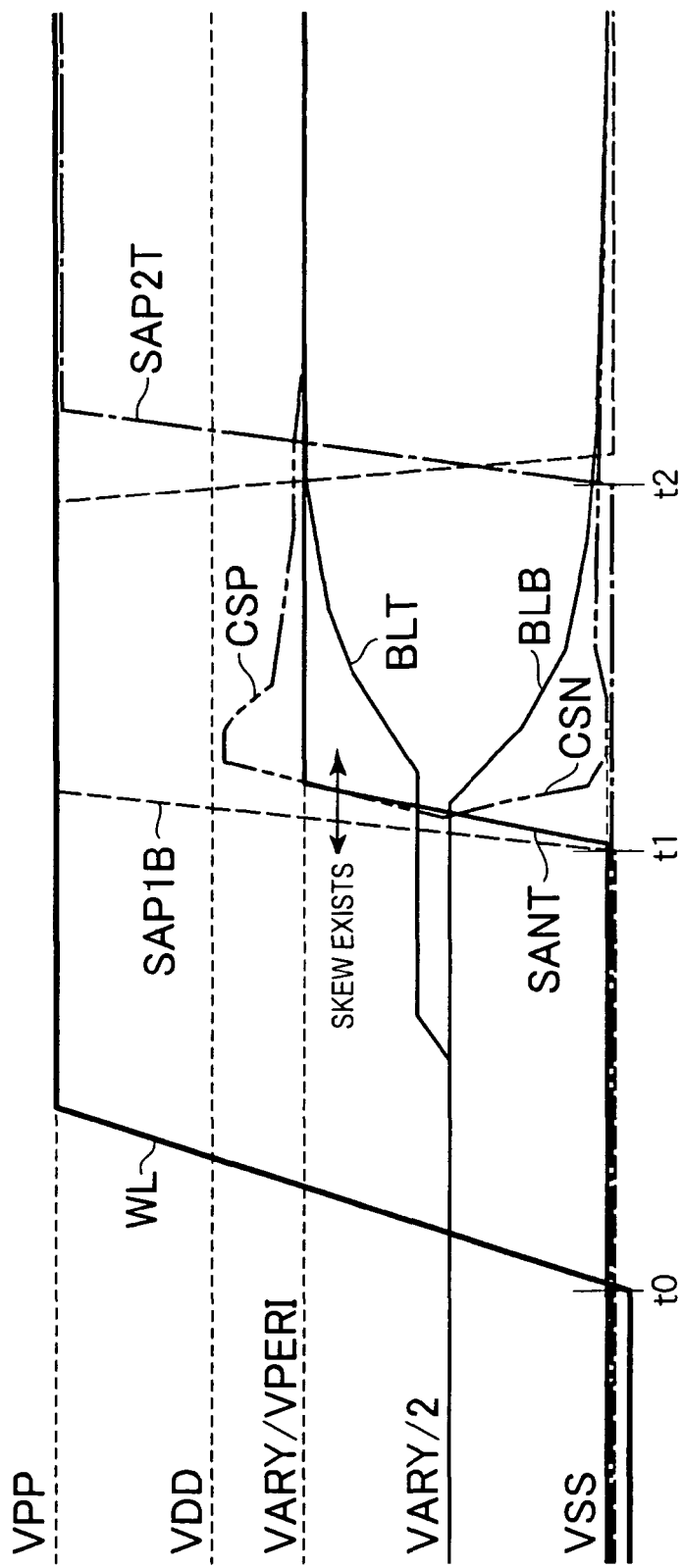
FIG. 13 is an operation waveform chart for explaining an operation of a sense amplifier SA according to the first prototype device shown in FIG. 12.

In this prototype, at time t1, the sense amplifier drive signals SAP1B and SANT are activated to the VPP level and the VPERI level, respectively, as shown in FIG. 13. The common source line CSP is thereby overdriven to the VDD level. The common source line CSN is driven to the VSS level. In the prototype, the level conversion circuit 81x is interposed in the path that generates the sense amplifier drive signal SAP1B while no level conversion circuit is interposed in the path that generates the sense amplifier drive signal SANT. This results in a skew between the two drive signals. The reason is that the two signals (SANT and SAP1B) for activating the sense amplifier, operating in the initial phase of a sensing operation, have respective different voltage amplitudes (SANT has an amplitude ranging from VSS to VPERI; SAP1B has an amplitude ranging from VSS to VPP).

Figure 14:
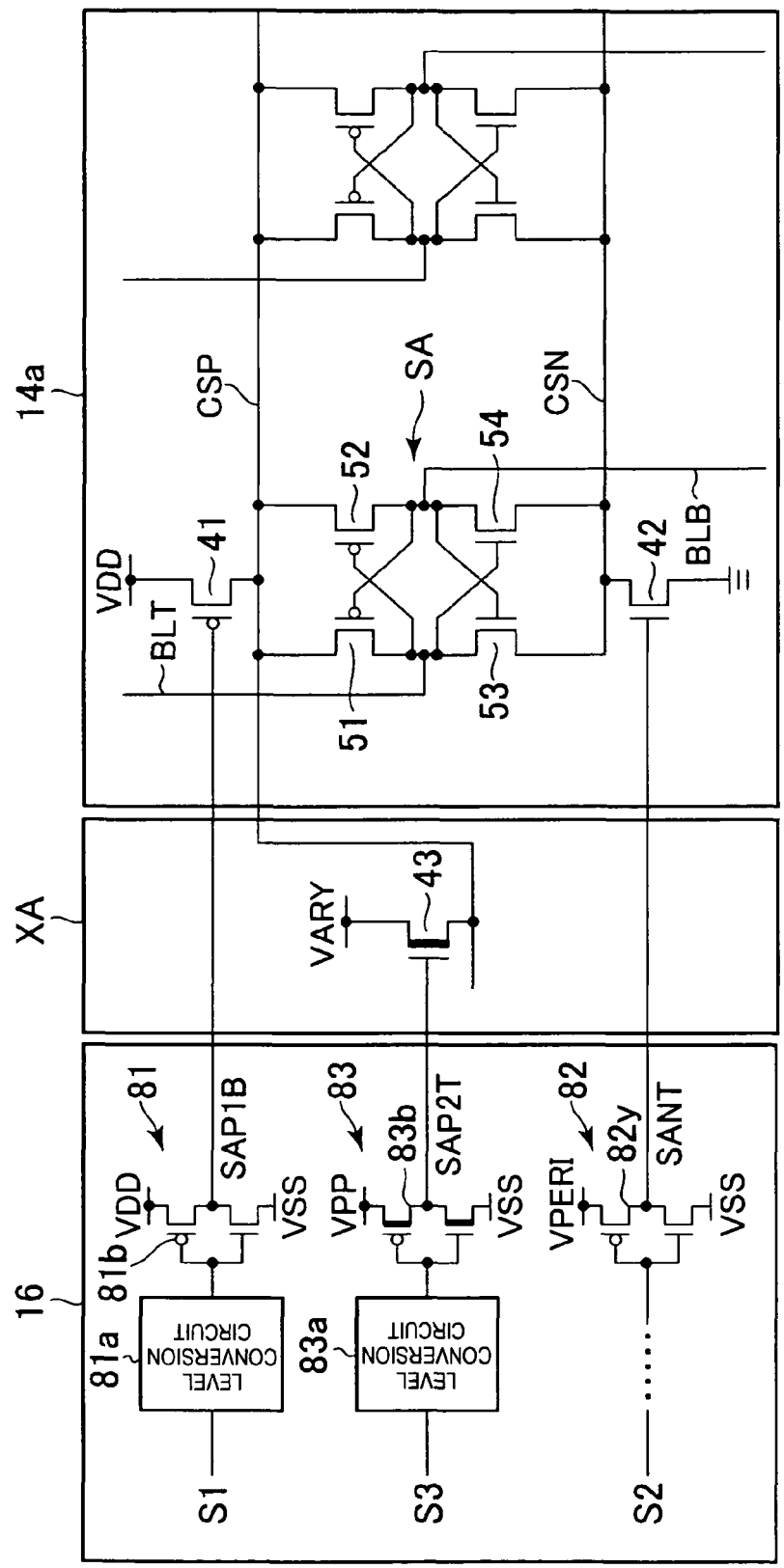
FIG. 14 is a diagram indicative of sense amplifiers SA and a part of circuits in a sense amplifier drive circuit 16 according to the second prototype device.

In a device shown in FIG. 14 that the inventor have conceived as a second prototype in the course of making the present invention, the sense amplifiers SA have the same configuration as in the present embodiment. The second prototype, however, differs from the present embodiment in that the sense amplifier drive circuit SANT has an amplitude ranging from the VSS level to the VPERI level. The level conversion circuit for converting the amplitude of the original signal S2 is thus omitted from the sense amplifier drive circuit 16. Even in this prototype, there is the level conversion circuit 81a interposed in the path that generates the sense amplifier drive signal SAP1B while there is no level conversion circuit interposed in the path that generates the sense amplifier drive signal SANT. This causes a skew between the two drive signals. As in the first prototype, the reason is that the two signals (SANT and SAP1B) for activating the sense amplifiers, operating in the initial phase of a sensing operation, have respective different voltage amplitudes (SANT has an amplitude ranging from VSS to VPERI; SAP1B has an amplitude ranging from VSS to VDD).

According to the present embodiment, unlike the prototypes, the common source lines CSP and CSN are driven by the voltages of the same amplitude (SANT with an amplitude ranging from VSS to VDD; SAP1B with an amplitude ranging from VSS to VDD). It is therefore possible to extend the sensing margin of the sense amplifiers without causing a skew. It is most preferred in the present embodiment that the cross points of the respective waveforms of SANT and SAP1B fall on VARY/2 or VDD/2. However, the cross points are not necessarily limited to such potentials. What is important is that SANT and SAP1B swing (oscillate) with the same voltage amplitude, from which point of view a skew is precluded in the present embodiment. The present embodiment is also characterized in that the sense amplifier drive signal SANT has a high-level potential of VDD, unlike the high-level potential VPERI of the sense amplifier drive signal SANT described in the second prototype (FIG. 14). In fact, whether the potential supplied to the gate electrode of the driver transistor 42 is VDD as discussed in the present embodiment or VPERI as discussed in the second prototype does not matter much to the characteristics of the sense amplifiers in the initial stage of operation. In the present embodiment, the high-level potential of VDD is given to the sense amplifier drive signal SANT because it can suppress the foregoing skew with respect to SAP1B.

Figure 15:
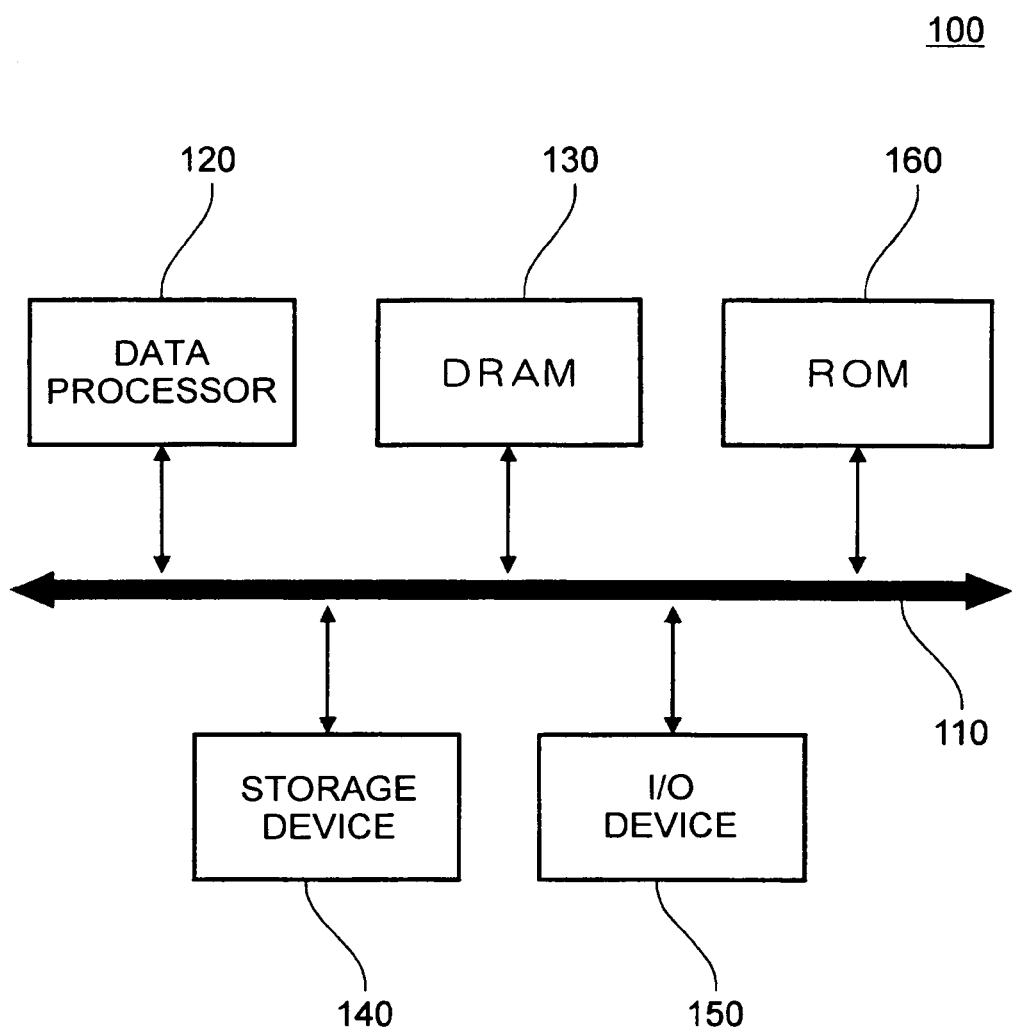
FIG. 15 is a block diagram indicative of a configuration of a data processing system 100 that uses the semiconductor device according to the embodiment of the present invention and indicative of a case where the semiconductor device according to the present embodiment is a DRAM.

Turning to FIG. 15, the data processing system 100 includes a data processor 120 and a DRAM 130 that the present embodiment is applied are connected to each other via a system bus 110. The data processor 120 can be selected from at least a microprocessor (MPU) and a digital signal processor (DSP). In FIG. 15, although the data processor 120 and the DRAM 130 are connected via the system bus 110 in order to simplify the diagram, they can be connected via not the system bus 110 but a local bus.

Further, in FIG. 15, although only one set of system bus 110 is employed in the data processing system 100 in order to simplify the diagram, a serial bus or a parallel bus connected to the system bus 110 via connectors can be provided. As shown in FIG. 15, a storage device 140, an I/O device 150, and a ROM 160 are connected to the system bus 110. However, they are not essential element for the data processing system 100.

The storage device 140 can be selected from at least a hard disk drive, an optical disk drive, and flash memory device. The I/O device 150 can be selected from a display device such as a liquid crystal display (LCD) and an input device such as a key board or a mouse. The I/O device 150 can consists of either input or output device. Further, although each one element is provided as shown in FIG. 15, two or more same elements can be provided in the data processing system.

It is apparent that the present invention is not limited to the above embodiments, but may be modified and changed without departing from the scope and spirit of the invention.

The technical concept of the present invention is applicable to input circuits of various circuit types (including CMOS type and current mirror type and the like). It should be noted that the forms of the circuits in the circuit blocks disclosed in the drawings and other circuits for generating control signals are not limited to the circuit forms disclosed in the embodiment.

The technical concept of the voltage level shift circuit of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following devices:

A1. A semiconductor device comprising:
first and second sense transistors of a first conductivity type that have respective power supply nodes connected in common to a first sense amplifier drive line, the first and second sense transistors being cross-coupled to each other so as to drive one of a pair of bit lines to a potential of the first sense amplifier drive line based on a potential difference between the pair of bit lines;
third and fourth sense transistors of a second conductivity type that have respective power supply nodes connected in common to a second sense amplifier drive line, the third and fourth sense transistors being cross-coupled to each other so as to drive the other of the pair of bit lines to a potential of the second sense amplifier drive line based on the potential difference between the pair of bit lines;
a first driver transistor connected between a first power supply line and the first sense amplifier drive line, the first power supply line being supplied with a first potential;
a second driver transistor connected between a second power supply line and the second sense amplifier drive line, the second power supply line being supplied with a second potential; and
a third driver transistor connected between a third power supply line and the first sense amplifier drive line, the third power supply line being supplied with a third potential, wherein a potential difference between the first potential and the second potential is greater than a potential difference between the third potential and the second potential, the first and second driver transistors turn ON and the third driver transistor turns OFF during a first period, the second and third driver transistors turn ON and the first driver transistor turns OFF during a second period subsequent to the first period, the first driver transistor has a control node supplied with a first sense amplifier drive signal, the second driver transistor has a control node supplied with a second sense amplifier drive signal, and the first and second sense amplifier drive signals have the same voltage amplitude.

A2. The semiconductor device as described in A1, wherein the first driver transistor has the first conductivity type, and the second driver transistor has the second conductivity type.

A3. The semiconductor device as described in A2, wherein each of the first and second sense amplifier drive signals has a voltage amplitude between the first and second potentials.

A4. The semiconductor device as described in A2 or A3, wherein the first potential is an external potential supplied from outside, and the third potential is an internal potential generated by lowering the first potential.

A5. The semiconductor device as described in A3 or A4, further comprising:

a first level conversion circuit that converts a first original signal in level to generate the first sense amplifier drive signal having a voltage amplitude ranging from the first potential to the second potential, the first original signal having a voltage amplitude ranging from a fourth potential to the second potential; and a second level conversion circuit that converts a second original signal in level to generate the second sense amplifier drive signal having a voltage amplitude ranging from the first potential to the second potential, the second original signal having a voltage amplitude ranging from the fourth potential to the second potential.

A6. The semiconductor device as described in any one of A1 to A5, wherein the third driver transistor has a control node supplied with a third sense amplifier drive signal, and the third sense amplifier drive signal has a voltage amplitude ranging from a fifth potential higher than the first potential to the second potential.

A7. The semiconductor device as described in A6, further comprising a third level conversion circuit that converts a third original signal in level to generate the third sense amplifier drive signal having a voltage amplitude ranging from the fifth potential to the second potential, the third original signal having a voltage amplitude ranging from the fourth potential to the second potential.

A8. The semiconductor device as described in A5 or A7, wherein the fourth potential is an internal potential generated by lowering the first potential.

A9. The semiconductor device as described in A5, wherein the first and second driver transistors activate simultaneously based on the first and second sense amplifier drive signals, respectively.

A10. The semiconductor device as described in any one of A1 to A6, wherein the first and second driver transistors have the same gate film thickness.

A11. The semiconductor device as described in A10, wherein the third driver transistor has a gate film thickness greater than that of the first and second driver transistors.

A12. A semiconductor device comprising:

first to fourth transistors each having a gate electrode, a drain electrode and a source electrode, the gate electrode of the first transistor being connected to the drain electrode of the second transistor, the gate electrode of the second transistor being connected to the drain electrode of the first transistor, the gate electrode of the third transistor being connected to the drain electrode of the fourth transistor, and the gate electrode of the fourth transistor being connected to the drain electrode of the third transistor;

a fifth transistor connected between the source electrodes of the first and second transistors and a first line supplied with a first potential;

a sixth transistor connected between the source electrodes of the third and fourth transistors and a second line supplied with a second potential;

a first driver that supplies a first control signal to a gate electrode of the fifth transistor, the first control signal having the first potential of a high-side and the second potential of a low-side; and a second driver that supplies a second control signal to a gate electrode of the sixth transistor, the second control signal having the first potential of a high-side and the second potential of a low-side.

A13. The semiconductor device as described in A12, further comprising:

a first level conversion circuit that converts a third control signal into a voltage amplitude ranging from the first potential to the second potential and supplies a resultant to the first driver, the third control signal having a third potential lower than the first potential and higher than the second potential of a high-side and the second potential of a low-side; and a second level conversion circuit that converts a fourth control signal into a voltage amplitude ranging from the first potential to the second potential and supplies a resultant to the second driver, the fourth control signal having the third potential of a high-side and the second potential of a low-side.

A14. The semiconductor device as described in A13, further comprising:

a seventh transistor connected between the source electrodes of the first and second transistors and a third line supplied with a fourth potential lower than the first potential and higher than the second potential; and a third driver that supplies a fifth control signal to a gate electrode of the seventh transistor, the fifth control signal having a fifth potential higher than the first potential of a high-side and the second potential of a low-side.

A15. The semiconductor device as described in A14, further comprising a third level conversion circuit that converts a sixth control signal into a voltage amplitude ranging from the fifth potential to the second potential and supplies a resultant to the third driver, the sixth control signal having the third potential of a high-side and the second potential of a low-side.

A16. The semiconductor device as described in A14 or A15, wherein the first to sixth transistors have a first gate insulator thickness, and the seventh transistor has a second gate insulating film thickness greater than the first gate insulating film thickness.

A17. The semiconductor device as described in any one of A12 to A16, further comprising:

a first bit line connected to the drain electrodes of the first and third transistors in common; and a second bit line connected to the drain electrodes of the second and fourth transistors in common, wherein the first to fourth transistors constitute a sense amplifier that senses information on first and second memory cells connected to the first and second bit lines, respectively.

A18. The semiconductor device as described in A17, wherein a plurality of the sense amplifiers are provided that are arranged in a first region, the fifth and sixth transistors are arranged in the first region, and the seventh transistor is arranged in a second region different from the first region.

A19. The semiconductor device as described in A18, wherein the first to third drivers and the first to third level conversion circuits are arranged in a third region different from the first and second regions.

A20. The semiconductor device as described in any one of A12 to A19, wherein the first potential is an external potential supplied to the semiconductor device.

What is claimed is:

1. A semiconductor device comprising:
a first well having a first conductivity type;
a second well having the first conductivity type;
a third well having a second conductivity type located between the first and second wells;
a first element isolation region defining a border between the first and third wells;
a second element isolation region defining a border between the second the third wells;
a first driver transistor of the second conductivity type formed adjacent to the first element isolation region on the first well;
a second driver transistor of the first conductivity type formed adjacent to the first element isolation region on the third well;
first and second sense transistors of the second conductivity type formed on the first well, the first and second sense transistors being arranged farther than the first driver transistor with respect to the first element isolation region, the first and second sense transistors being cross-coupled to each other;
third and fourth sense transistors of the first conductivity type formed on the third well, the third and fourth sense transistors being arranged farther than the second driver transistor with respect to the first element isolation region, the third and fourth sense transistors being cross-coupled to each other;
a third driver transistor of the second conductivity type formed adjacent to the second element isolation region on the second well;
a fourth driver transistor of the first conductivity type formed adjacent to the second element isolation region on the third well;
fifth and sixth sense transistors of the second conductivity type formed on the second well, the fifth and sixth sense transistors being arranged farther than the third driver transistor with respect to the second element isolation region, the fifth and sixth sense transistors being cross-coupled to each other; and
seventh and eighth sense transistors of the first conductivity type formed on the third well, the seventh and eighth sense transistors being arranged farther than the fourth driver transistor with respect to the second element isolation region, the seventh and eighth sense transistors being cross-coupled to each other, wherein
the first to fourth sense transistors constitute a first sense amplifier powered by the first and second driver transistors, and
the fifth to eighth sense transistors constitute a second sense amplifier powered by the third and fourth driver transistors.

2. The semiconductor device as claimed in claim 1, wherein the first to third wells are arranged in a first direction.

3. The semiconductor device as claimed in claim 2, wherein the first to eighth sense transistors are arranged in the first direction.

4. The semiconductor device as claimed in claim 3, wherein distances between the first element isolation region and the first and second sense transistors are different from each other, distances between the first element isolation region and the third and fourth sense transistors are different from each other, distances between the second element isolation region and the fifth and sixth sense transistors are different from each other, and distances between the second element isolation region and the seventh and eighth sense transistors are different from each other.

5. The semiconductor device as claimed in claim 4, wherein the first sense amplifier is coupled to a first pair of bit lines that extend in the first direction, the second sense amplifier is coupled to a second pair of bit lines that extend in the first direction, and the first and second sense amplifiers constitute an unit pattern, a plurality of unit patterns are repeatedly arranged in a second direction substantially orthogonal to the first direction.

6. The semiconductor device as claimed in claim 5, wherein the first driver transistor supplies a first potential to power supply nodes of the first and second sense transistors, the second driver transistor supplies a second potential to power supply nodes of the third and fourth sense transistors, the third driver transistor supplies the first potential to power supply nodes of the fifth and sixth sense transistors, the fourth driver transistor supplies the second potential to power supply nodes of the seventh and eighth sense transistors, the first and second sense transistors drive either one of the first pair of bit lines to the first potential based on a potential difference occurring between the first pair of bit lines, the third and fourth sense transistors drive the other of the first pair of bit lines to the second potential based on the potential difference occurring between the first pair of bit lines, the fifth and sixth sense transistors drive either one of the second pair of bit lines to the first potential based on a potential difference occurring between the second pair of bit lines, and the seventh and eighth sense transistors drive the other of the second pair of bit lines to the second potential based on the potential difference occurring between the second pair of bit lines.

7. The semiconductor device as claimed in claim 2, wherein
   each of the first to eighth sense transistors passes a current in the same direction as an extending direction of the first and second element isolation regions, and
   each of the first to fourth driver transistors passes a current in a direction substantially orthogonal to the extending direction of the first and second element isolation regions.

8. The semiconductor device as claimed in claim 2, wherein
   the first and second wells have a P-type,
   the third well has an N-type;
   the first and third driver transistors and the first, second, fifth and sixth sense transistors are N-channel field-effect transistors, and
   the second and fourth driver transistors and the third, fourth, seventh and eighth sense transistors are P-channel field-effect transistors.

9. The semiconductor device as claimed in claim 2, further comprising a third driver transistor that supplies a third potential to power supply nodes of the third, fourth, seventh and eighth sense transistors, wherein
   the first driver transistor supplies a first potential to power supply nodes of the first and second sense transistors,
   the second driver transistor supplies a second potential to the power supply nodes of the third and fourth sense transistors,
   the third driver transistor supplies the first potential to power supply nodes of the fifth and sixth sense transistors,
   the fourth driver transistor supplies the second potential to the power supply nodes of the seventh and eighth sense transistors, and
   a potential difference between the first and second potentials is greater than a potential difference between the first and third potentials.

10. The semiconductor device as claimed in claim 9, wherein the third driver transistor turns ON after the second and fourth driver transistors turns OFF.

11. The semiconductor device as claimed in claim 10, wherein the second potential is an external potential supplied from outside, and the third potential is an internal potential generated by lowering the second potential.

12. The semiconductor device as claimed in claim 10, wherein
   the second and fourth driver transistors have control nodes supplied with a first sense amplifier drive signal in common,
   the first and third driver transistors have control nodes supplied with a second sense amplifier drive signal in common, and
   the first and the second sense amplifier drive signals have the same amplitude.

13. The semiconductor device as claimed in claim 12, wherein the first and second sense amplifier drive signals have an amplitude that ranges from the first potential and the second potential.

14. The semiconductor device as claimed in claim 10, wherein a first gate film thickness of the first and third driver transistors is substantially the same as a second gate film thickness of the second and fourth driver transistors.

15. The semiconductor device as claimed in claim 14, wherein a third gate film thickness of the first to eighth sense transistors is substantially the same as the first and second gate film thicknesses.

16. The semiconductor device as claimed in claim 14, wherein a fourth gate film thickness of the third driver transistor is greater than the first and second gate film thicknesses.

17. A semiconductor device comprising:
   a first sense amplifier including first to fourth transistors;
   a second sense amplifier including fifth to eighth transistors;
   a ninth transistor supplying an operating voltage to the first and second transistors;
   a tenth transistor supplying an operating voltage to the third and fourth transistors;
   an eleventh transistor supplying an operating voltage to the fifth and sixth transistors;
   a twelfth transistor supplying an operating voltage to the seventh and eighth transistors;
   a first well in which the first, second, and ninth transistors are formed;
   a second well in which the third to sixth, tenth, and eleventh transistors are formed; and
   a third well in which the seventh, eighth, and twelfth transistors are formed, wherein
   the second well is located between the first and third wells,
   the first to third wells are arranged in a first direction,
   the first to eighth transistors are arranged in the first direction,
   the ninth transistor is located between the first or second transistor and a border of the first and second wells in the first direction,
   the tenth transistor is located between the third or fourth transistor and the border of the first and second wells in the first direction,
   the eleventh transistor is located between the fifth or sixth transistor and a border of the second and third wells in the first direction, and
   the twelfth transistor is located between the seventh or eighth transistor and the border of the second and third wells in the first direction.

18. The semiconductor device as claimed in claim 17, wherein
   the first transistor has a gate electrode connected to a drain electrode of the second transistor,
   the second transistor has a gate electrode connected to a drain electrode of the first transistor,
   the third transistor has a gate electrode connected to a drain electrode of the fourth transistor,
   the fourth transistor has a gate electrode connected to a drain electrode of the third transistor,
   the fifth transistor has a gate electrode connected to a drain electrode of the sixth transistor,
   the sixth transistor has a gate electrode connected to a drain electrode of the fifth transistor,
   the seventh transistor has a gate electrode connected to a drain electrode of the eighth transistor,
   the eighth transistor has a gate electrode connected to a drain electrode of the seventh transistor,
   the drain electrodes of the first and fourth transistors are connected in common to a first bit line that extends in the first direction;
   the drain electrodes of the second and third transistors are connected in common to a second bit line that extends in the first direction,
   the drain electrodes of the fifth and eighth transistors are connected in common to a third bit line that extends in the first direction,
   the drain electrodes of the sixth and seventh transistors are connected in common to a fourth bit line that extends in the first direction, and
   the first and second sense amplifiers constitute an unit pattern, a plurality of unit patterns are repeatedly arranged in a second direction substantially orthogonal to the first direction.

19. The semiconductor device as claimed in claim 18, wherein
- each of the ninth to twelfth transistors has a gate electrode that extends in the second direction, and
- each of the gate electrodes of the first to eighth transistors extend in the first direction.

20. The semiconductor device as claimed in claim 19, further comprising:
- a first memory cell array including a plurality of first memory cells, the first memory cell array being located such that the first well is sandwiched between the first memory cell array and the second well; and
- a second memory cell array including a plurality of second memory cells, the second memory cell array being located such that the third well is sandwiched between the second memory cell array and the second well, wherein
- each of the first and fourth bit lines is connected to respective corresponding ones of the plurality of first memory cells, and
- each of the second and third bit lines is connected to respective corresponding ones of the plurality of second memory cells,
- whereby the first to fourth bit lines constitute open bit lines with respect to the first and second sense amplifiers.

* * * * *